US008861751B2

(12) United States Patent
Misaki et al.

(10) Patent No.: US 8,861,751 B2
(45) Date of Patent: Oct. 14, 2014

(54) AUDIO PROCESSING APPARATUS

(75) Inventors: Hinako Misaki, Osaka (JP); Norio Etoh, Osaka (JP); Tadaharu Sunaga, Osaka (JP); Susumu Koaze, Osaka (JP); Junichi Kobayashi, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 785 days.

(21) Appl. No.: 13/025,286

(22) Filed: Feb. 11, 2011

(65) Prior Publication Data

US 2011/0243334 A1 Oct. 6, 2011

(30) Foreign Application Priority Data

Apr. 2, 2010 (JP) ................................ 2010-085643
Nov. 25, 2010 (JP) ................................ 2010-261868

(51) Int. Cl.

| | |
|---|---|
| ***H02B 1/00*** | (2006.01) |
| ***H03F 99/00*** | (2009.01) |
| ***H04R 5/00*** | (2006.01) |
| ***H04R 5/02*** | (2006.01) |
| ***H04S 3/00*** | (2006.01) |
| ***H04S 7/00*** | (2006.01) |
| ***H04R 5/04*** | (2006.01) |

(52) U.S. Cl.

CPC ............... *H04S 3/00* (2013.01); *H04R 2420/03* (2013.01); *H04R 2420/01* (2013.01); *H04S 7/30* (2013.01); *H04R 5/04* (2013.01)
USPC ............. 381/123; 381/120; 381/28; 381/303; 381/307

(58) Field of Classification Search

USPC ............. 381/123, 120, 1, 12, 17–23, 28, 300, 381/301, 303, 306, 307
See application file for complete search history.

(56) References Cited

U.S. PATENT DOCUMENTS 4,953,213 A 8/1990 Tasaki et al.
6,167,140 A 12/2000 Watanabe
(Continued)

FOREIGN PATENT DOCUMENTS

| | | |
|---|---|---|
| EP | 0 866 638 A2 | 9/1998 |
| JP | 2-098598 | 8/1990 |
| JP | 03-080639 | 4/1991 |
| JP | 05-091599 | 4/1993 |
| JP | 07-162384 | 6/1995 |

(Continued)

OTHER PUBLICATIONS

EP Search Report for corresponding European Application No. 11 153 205.7 mailed Jun. 5, 2012.

*Primary Examiner* — Vivian Chin
*Assistant Examiner* — David Ton
(74) *Attorney, Agent, or Firm* — Renner, Otto, Boisselle & Sklar, LLP

(57) ABSTRACT

In an audio processing apparatus of the present invention, one or two audio signals selected from a surround rear left audio signal, a left outer audio signal and a left upper audio signal is (are) amplified to be outputted from a speaker terminal(s) corresponding to this (these) channel(s) without necessity to provide amplifiers of all channels. When the surround rear left audio signal is included, a switch S13*a* is turned ON to supply the surround rear left audio signal amplified by an amplifier 12*a* to a SP terminal 14*a*. When the left outer audio signal is included, a switch 13*b* is turned ON to supply the left outer audio signal amplified by the amplifier 12*a* to a SP terminal 14*b*, or a switch 13*c* is turned ON to supply the left outer audio signal amplified by an amplifier 12*b* to the SP terminal 14*b*. When the left upper audio signal is included, a switch 13*d* is turned ON to supply the left upper audio signal amplified by the amplifier 12*b* to a SP terminal 14*c*.

10 Claims, 15 Drawing Sheets

(56) References Cited

U.S. PATENT DOCUMENTS

| | | | | |
|---|---|---|---|---|
| 6,681,018 | B1 * | 1/2004 | Asakura et al. | 381/18 |
| 7,978,865 | B2 * | 7/2011 | Sunaga et al. | 381/123 |
| 8,081,781 | B2 * | 12/2011 | Watanabe | 381/123 |
| 8,494,183 | B2 * | 7/2013 | Sunaga et al. | 381/123 |
| 2002/0006081 | A1 | 1/2002 | Fujishita | |
| 2007/0127925 | A1 | 6/2007 | Hayashibara | |
| 2009/0016539 | A1 | 1/2009 | Watanabe | |
| 2010/0195848 | A1 | 8/2010 | Sunaga et al. | |

FOREIGN PATENT DOCUMENTS

| | | |
|---|---|---|
| JP | 2003-304125 | 10/2003 |
| JP | 2006-222765 | 8/2006 |
| JP | 2006-237928 | 9/2006 |
| JP | 2006-279537 | 10/2006 |
| JP | 2007-116643 | 5/2007 |
| JP | 2007-150406 | 6/2007 |
| JP | 2007-151173 | 6/2007 |
| JP | 2007-158561 | 6/2007 |
| JP | 2009-194893 | 8/2009 |

* cited by examiner

AUDIO PROCESSING APPARATUS

BACKGROUND OF THE INVENTION

1. Field of the Invention

The present invention relates to an audio processing apparatus that reproduces multichannel audio data.

2. Description of the Related Art

An audio reproducing system including a BD (Blu-ray Disc) player, an AV amplifier and a display apparatus has been utilized. The audio data transmitted from the BD player to the AV amplifier is obtained by encoding multichannel audio data. For example, the multichannel audio data includes a left audio signal L, a right audio signal R, a central audio signal C, a low-frequency audio signal SW, a surround left audio signal SL, and a surround right audio signal SR, as shown in FIG. 3. Recently, audio formats relating to HD (High Definition) such as Dolby True HD, Dolby Digital Plus, DTS-HD and the like, which are used in the BD player, have emerged, and in these formats, a surround rear left audio signal SBL, a surround rear right audio signal SBR, a left outer audio signal LW, a right outer audio signal RW, a left upper audio signal LH, and a right upper audio signal RH are further added.

However, if amplifiers corresponding to the audio signals of all these channels are provided in the AV amplifier, the amplifiers of a total of 11.1 channels will be provided, thus largely increasing a cost. This is true in the case where in place of any one of the above-described extended channels (or in addition to the above-described extended channels), a left central audio signal LC, and a right central audio signal RC are added, as shown in FIG. 8. Furthermore, this is also true in the case where the AV amplifier generates the above-described extended channels in a DSP in accordance with a listening mode.

SUMMARY OF THE INVENTION

The present invention is achieved in order to solve the above-described conventional problem, and an object thereof is to provide an audio processing apparatus capable of amplifying one or two audio signals selected from a first extended left audio signal, a second extended left audio signal, and a third extended left audio signal to be outputted from a speaker terminal(s) corresponding this (these) channels without necessity to provide amplifiers of all channels.

According to a preferred embodiment of the present invention, an audio processing apparatus comprises: a first amplifying unit that amplifies a first extended audio signal or a second extended audio signal, the first extended audio signal being a first extended left audio signal or a first extended right audio signal, and the second extended audio signal being a second extended left audio signal or a second extended right audio signal; a second amplifying unit that amplifies a second extended audio signal or a third extended audio signal, the third extended audio signal being a third extended left audio signal or a third extended right audio signal; a first speaker terminal that outputs the first extended audio signal; a second speaker terminal that outputs the second extended audio signal; a third speaker terminal that outputs the third extended audio signal; a first switch that performs switching as to whether or not the first extended audio signal from the first amplifying unit is to be supplied to the first speaker terminal; a second switch that performs switching as to whether or not the second extended audio signal from the first amplifying unit is to be supplied to the second speaker terminal; a third switch that performs switching as to whether or not the second extended audio signal from the second amplifying unit is to be supplied to the second speaker terminal; a fourth switch that performs switching as to whether or not the third extended audio signal from the second amplifying unit is to be supplied to the third speaker terminal; a channel determining unit that determines which of the first extended audio signal, the second extended audio signal, and the third extended audio signal is included in multichannel audio data; and a switching control unit that if it is determined that the first extended audio signal is included, causes the first switch to supply the first extended audio signal amplified by the first amplifying unit to the first speaker terminal, if it is determined that the second extended audio signal is included, causes the second switch to supply the second extended audio signal amplified by the first amplifying unit to the second speaker terminal, or causes the third switch to supply the second extended audio signal amplified by the second amplifying unit to the second speaker terminal, and if it is determined that the third extended audio signal is included, causes the fourth switch to supply the third extended audio signal amplified by the second amplifying unit to the third speaker terminal.

Which channel is included in the multichannel audio data is determined, and the included channel is amplified by the first amplifying unit or by the second amplifying unit, so that by providing only the two amplifying units, one or two audio signals selected from the first extended left audio signal, the second extended left audio signal, and the third extended left audio signal can be amplified to be outputted to the speaker terminal(s) corresponding to this (these) channel(s). Similarly, by providing only the two amplifying units, one or two audio signals selected from the first extended right audio signal, the second extended right audio signal, and the third extended right audio signal can be amplified to be outputted to the speaker terminal(s) corresponding to this (these) channel(s).

Preferably, the first extended left audio signal is any of a surround rear left audio signal, a left outer audio signal, a left upper audio signal and a left central audio signal, and the first extended right audio signal is any of a surround rear right audio signal, a right outer audio signal, a right upper audio signal and a right central audio signal, the second extended left audio signal is any of the surround rear left audio signal, the left outer audio signal, the left upper audio signal and the left central audio signal, and is different from the first extended left audio signal, and the second extended right audio signal is any of the surround rear right audio signal, the right outer audio signal, the right upper audio signal and the right central audio signal, and is different from the first extended right audio signal, and the third extended left audio signal is any of the surround rear left audio signal, the left outer audio signal, the left upper audio signal and the left central audio signal, and is different from the first extended left audio signal and the second extended left audio signal, and the third extended right audio signal is any of the surround rear right audio signal, the right outer audio signal, the right upper audio signal and the right central audio signal, and is different from the first extended right audio signal and the second extended right audio signal.

Preferably, if it is determined that the first extended audio signal is not included and that the second extended audio signal is included, the switching control unit causes the second switch to supply the second extended audio signal amplified by the first amplifying unit to the second speaker terminal, and if it is determined that the first extended audio signal is included and that the second extended audio signal is included, the switching control unit causes the third switch to supply the second extended audio signal amplified by the second amplifying unit to the second speaker terminal.

Preferably, if it is determined that the first extended audio signal and the second extended audio signal are included, the switching control unit causes the first switch to supply the first extended audio signal amplified by the first amplifying unit to the first speaker terminal, and causes the third switch to supply the second extended audio signal amplified by the second amplifying unit to the second speaker terminal, if it is determined that the first extended audio signal and the third extended audio signal are included, the switching control unit causes the first switch to supply the first extended audio signal amplified by the first amplifying unit to the first speaker terminal, and causes the fourth switch to supply the third extended audio signal amplified by the second amplifying unit to the third speaker terminal, and if it is determined that the second extended audio signal and the third extended audio signal are included, the switching control unit causes the second switch to supply the second extended audio signal amplified by the first amplifying unit to the second speaker terminal, and causes the fourth switch to supply the third extended audio signal amplified by the second amplifying unit to the third speaker terminal.

Preferably, if it is determined that the first extended audio signal, the second extended audio signal, and the third extended audio signal are included, the switching control unit operates so that the two audio signals set by user operation in advance are supplied to the respective corresponding speaker terminals.

Preferably, the first amplifying unit amplifies the first extended audio signal, the second extended audio signal, or a fourth extended audio signal, the fourth extended audio signal being a fourth extended left audio signal or a fourth extended right audio signal, the second amplifying unit amplifies the second extended audio signal, the third extended audio signal or the fourth extended audio signal, the audio processing apparatus further comprises: a fourth speaker terminal that outputs the fourth extended audio signal; a fifth switch that performs switching as to whether or not the fourth extended audio signal from the first amplifying unit is to be supplied to the fourth speaker terminal; and a sixth switch that performs switching as to whether or not the fourth extended audio signal from the second amplifying unit is to be supplied to the fourth speaker terminal, the channel determining unit further determines whether or not the fourth extended audio signal is included in the multichannel audio data, and if it is determined that the fourth extended audio signal is included, the switching control unit causes the fifth switch to supply the fourth extended audio signal amplified by the first amplifying unit to the fourth speaker terminal, or causes the sixth switch to supply the fourth extended audio signal amplified by the second amplifying unit to the fourth speaker terminal.

Preferably, the audio processing apparatus further comprises a pre-out terminal that outputs the second extended audio signal at a stage before supplying the same to the first amplifying unit or the second amplifying unit, and if it is determined that the first extended audio signal, the second extended audio signal, and the third extended audio signal are included, the switching control unit causes the first switch to supply the first extended audio signal amplified by the first amplifying unit to the first speaker terminal, causes the fourth switch to supply the third extended audio signal amplified by the second amplifying unit to the third speaker terminal, and causes the second extended audio signal to be outputted from the pre-out terminal.

Preferably, the audio processing apparatus further comprises: a first pre-out terminal that outputs the second extended audio signal at a stage before supplying the same to the first amplifying unit or the second amplifying unit; and a second pre-out terminal that outputs the fourth extended audio signal at the stage before supplying the same to the first amplifying unit or the second amplifying unit, wherein if it is determined that the first extended audio signal, the second extended audio signal, the third extended audio signal, and the fourth extended audio signal are included, the switching control unit causes the first switch to supply the first extended audio signal amplified by the first amplifying unit to the first speaker terminal, causes the fourth switch to supply the third extended audio signal amplified by the second amplifying unit to the third speaker terminal, causes the second extended audio signal to be outputted from the first pre-out terminal, and causes the fourth extended audio signal to be outputted from the second pre-out terminal.

Preferably, the audio processing apparatus further comprises: a third amplifying unit that amplifies the second extended audio signal or a fourth extended audio signal, the fourth extended audio signal being a fourth extended left audio signal or a fourth extended right audio signal; a fourth speaker terminal that outputs the fourth extended audio signal; a fifth switch that performs switching as to whether or not the second extended audio signal from the third amplifying unit is to be supplied to the second speaker terminal; and a sixth switch that performs switching as to whether or not the fourth extended audio signal from the third amplifying unit is to be supplied to the fourth speaker terminal, wherein the channel determining unit further determines whether or not the fourth extended audio signal is included in the multichannel audio data, and if it is determined that the second extended audio signal is included, the switching control unit causes the second switch to supply the second extended audio signal amplified by the first amplifying unit to the second speaker terminal, causes the third switch to supply the second extended audio signal amplified by the second amplifying unit to the second speaker terminal, or causes the fifth switch to supply the second extended audio signal amplified by the third amplifying unit to the second speaker terminal, and if it is determined that the fourth extended audio signal is included, the switching control unit causes the sixth switch to supply the fourth extended audio signal amplified by the third amplifying unit to the fourth speaker terminal.

Preferably, the audio processing apparatus further comprises a pre-out terminal that outputs the second extended audio signal at a stage before supplying the same to the first amplifying unit, the second amplifying unit, or the third amplifying unit, and if it is determined that the first extended audio signal, the second extended audio signal, the third extended audio signal, and the fourth extended audio signal are included, the switching control unit causes the first switch to supply the first extended audio signal amplified by the first amplifying unit to the first speaker terminal, causes the fourth switch to supply the third extended audio signal amplified by the second amplifying unit to the third speaker terminal, causes the sixth switch to supply the fourth extended audio signal amplified by the third amplifying unit to the fourth speaker terminal, and causes the second extended audio signal to be outputted from the pre-out terminal.

DETAILED DESCRIPTION OF THE PREFERRED EMBODIMENTS

Figure 1:
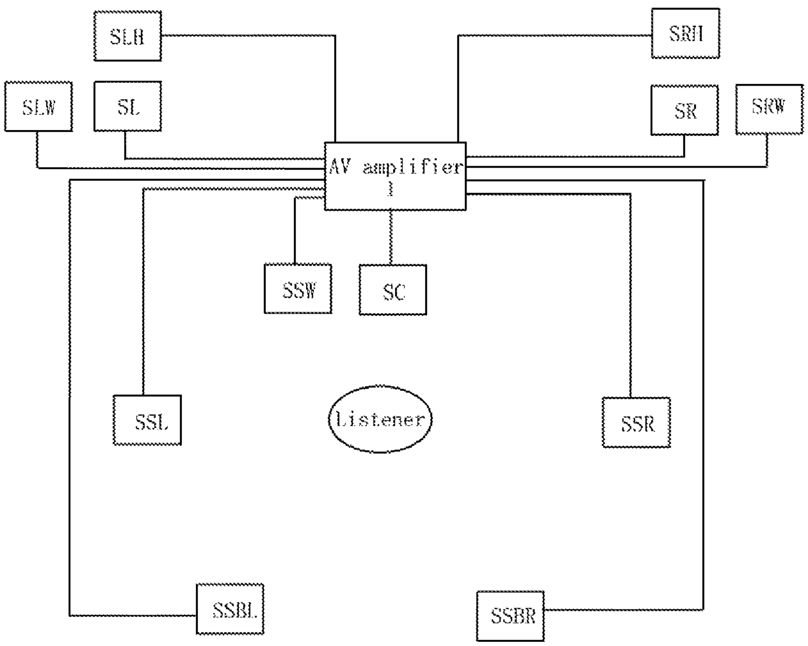
FIG. 1 is a diagram showing arrangement of an AV amplifier 1 and speakers.

Hereinafter, an audio reproducing system according to preferred embodiments of the present invention, including a disk reproducing apparatus (hereinafter, referred to as a BD player), an audio processing apparatus (hereinafter, referred to as an AV amplifier), and a display apparatus is specifically described with reference to the drawings. However, the present invention is not limited to these embodiments. FIG. 1 is a diagram for explaining one example of arrangement of an AV amplifier 1, and respective speakers. To the AV amplifier 1 are connected a left speaker SL, a right speaker SR, a central speaker SC, a low-frequency speaker SSW, a surround left speaker SSL, a surround right speaker SSR, a surround rear left speaker SSBL, a surround rear right speaker SSBR, a left upper speaker SLH, a right upper speaker SRH, a left outer speaker SLW, and a right outer speaker SRW.

Figure 2:
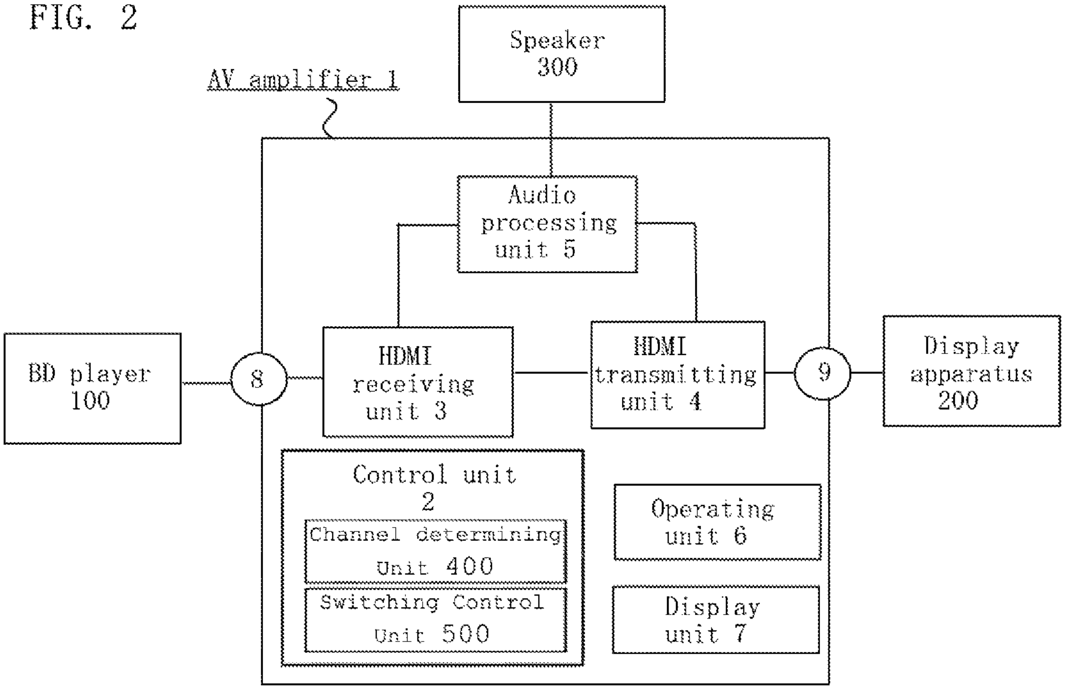
FIG. 2 is a diagram showing an audio reproducing system.

FIG. 2 is a block diagram showing a configuration of the audio reproducing system. A BD player 100, the AV amplifier 1 and a display apparatus 200 conform to, for example, an HDMI standard, and are connected to one another through an HDMI cable. The BD player 100 transmits HDMI data including multichannel audio data and video data to the AV amplifier 1. The AV amplifier 1 amplifies the multichannel audio data included in the HDMI data received from the BD player 100 to output to the speakers. Moreover, the AV amplifier 1 transmits the HDMI data including the video data to the display apparatus 200. The display apparatus 200 displays the video data included in the HDMI data received from the AV amplifier 1.

The AV amplifier 1 has a control unit 2, an HDMI receiving unit 3, an HDMI transmitting unit 4, an audio processing unit 5, an operation unit 6, a display unit 7, and HDMI terminals 8, 9. To the AV amplifier 1 is connected a speaker 300 (corresponding to each of the speakers in FIG. 1).

The control unit 2 includes a channel determining unit 400 that determines which audio signals are included in the multichannel audio data. Control unit 2 further includes a switching control unit 500 that controls whether each switch supplies a respective audio signal to a speaker terminal. Hereinafter, the control unit 2 may be referred to generally as controlling the processes controlled by the channel determining unit 400 and switching control unit 500.

The HDMI receiving unit 3 receives the HDMI data transmitted from the BD player 100, generates the original video data from the received HDMI data to supply to the HDMI transmitting unit 4. Moreover, the HDMI receiving unit 3 generates the original multichannel audio data from the received HDMI data to supply to the audio processing unit 5.

Figure 3:
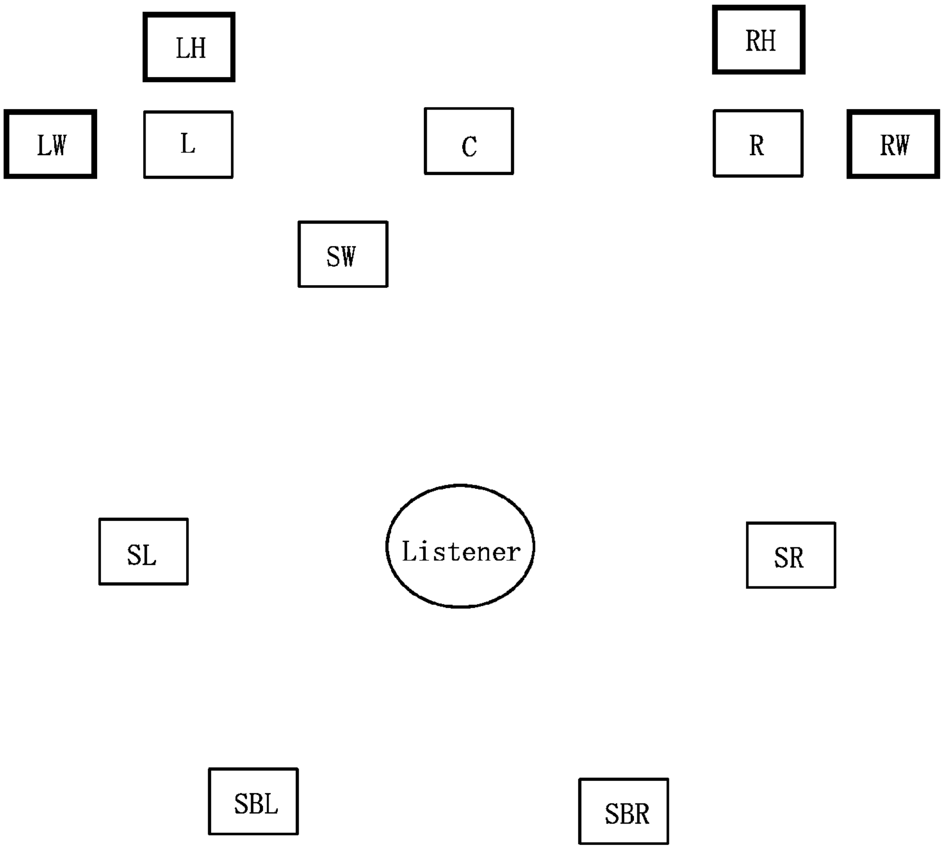
FIG. 3 is a diagram showing channels of audio signals.

The audio processing unit 5 decodes the multichannel audio data supplied from the HDMI receiving unit 3, executes various types of processing such as sound processing, D/A conversion processing, volume adjustment processing, amplification processing and the like to supply the audio signal of each of the channels to the speaker 300. The multichannel audio data supplied to the audio processing unit 5 is described. In audio formats relating to HD (High Definition) such as Dolby True HD, Dolby Digital Plus, DTS-HD and the like, as shown in FIG. 3, for example, a left audio signal L (front left audio signal), a right audio signal R (front right audio signal), a central audio signal C, a low-frequency audio signal SW, a surround left audio signal SL, a surround right audio signal SR, a surround rear left audio signal SBL, a surround rear right audio signal SBR, a left outer audio signal LW, a right outer audio signal RW, a left upper audio signal LH, a right upper audio signal RH and the like are included.

The surround rear left audio signal SBL is an audio signal reproduced at a position on the rear left side of a user. The surround rear right audio signal SBR is an audio signal reproduced at a position on the rear right side of the user. The left outer audio signal LW is an audio signal reproduced at a position outside (on the left side of) the left audio signal L (i.e., on the front left outer side of a user). The right outer audio signal RW is an audio signal reproduced at a position outside (on the right side of) the right audio signal R (i.e., on the front right outer side of the user). The left upper audio signal LH is an audio signal reproduced at a position above the left audio signal L (i.e., on the front left upper side of the user). The right upper audio signal RH is an audio signal reproduced at a position above the right audio signal R (i.e., on the front right upper side of the user).

Figure 4:
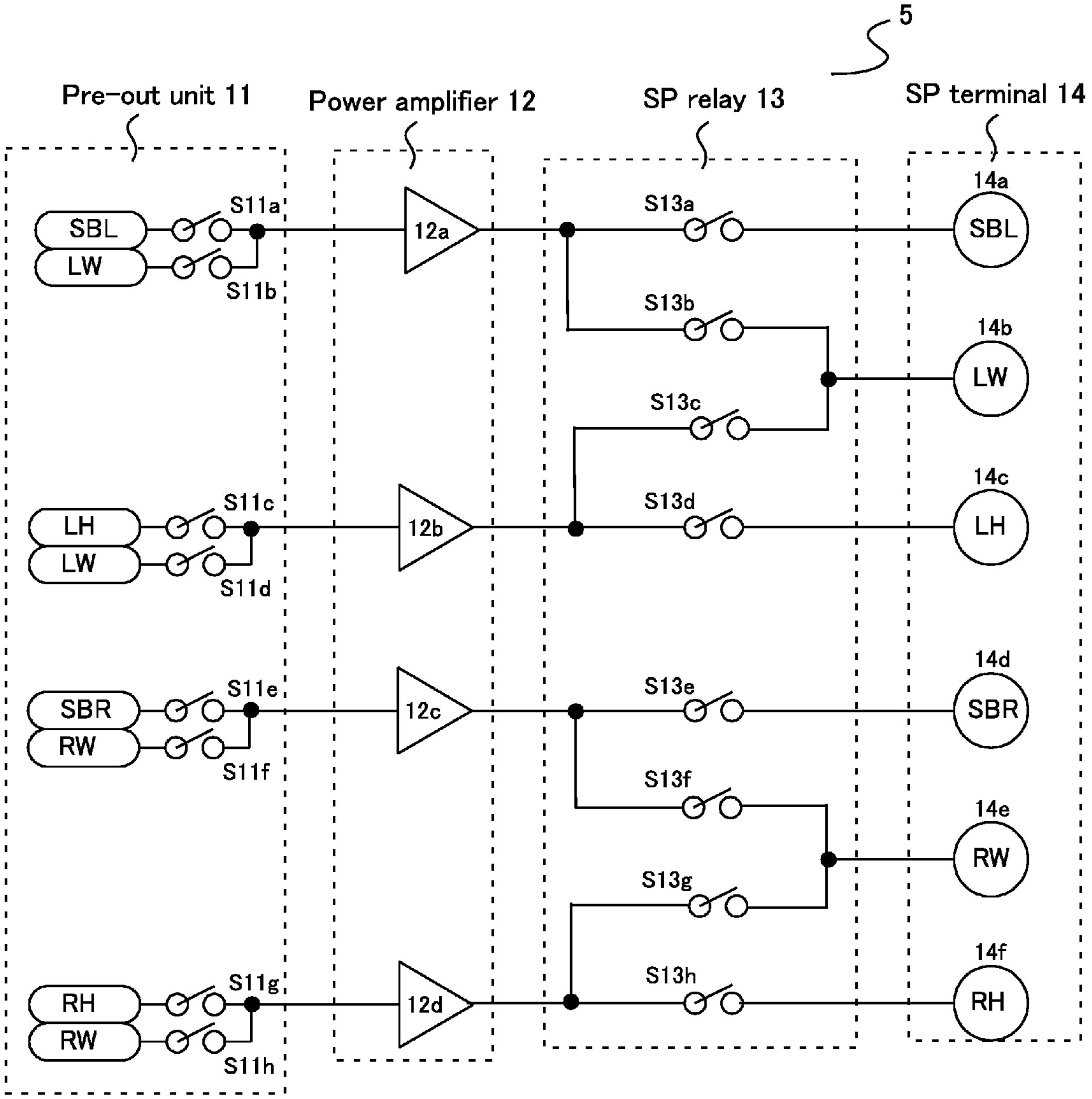
FIG. 4 is a diagram showing an audio processing unit 5.

FIG. 4 is a block diagram showing a substantial part of the audio processing unit 5. The audio processing unit 5 has a pre-out unit 11, a power amplifier 12, a SP (speaker) relay 13, and a SP (speaker) terminal 14. In FIG. 4, since respective circuits relating to the basic 5.1 channels (the left audio signal L, the right audio signal R, the central audio signal C, the low-frequency audio signal SW, the surround left audio signal SL, and the surround right audio signal SR) are the same as those in conventional art, they are omitted. Moreover, a DSP and the like provided at a previous stage of the pre-out unit 11 are also omitted.

The DSP decodes and D/A converts the multichannel audio data supplied from the HDMI receiving unit 3 to generate the audio signals of the respective channels. The generated audio signals are supplied to the pre-out unit 11.

The pre-out unit 11 has switches S11*a* to S11*h*. The switch S11*a* performs switching as to whether or not the surround rear left audio signal SBL is to be outputted to an amplifier 12*a*. The switch S11*b* performs switching as to whether or not the left outer audio signal LW is to be outputted to the amplifier 12*a*. The switch S11*c* performs switching as to whether or not the left upper audio signal LH is to be outputted to an amplifier 12*b*. The switch S11*d* performs switching as to whether or not the left outer audio signal LW is to be outputted to the amplifier 12*b*. Any one of the switches S11*a*, S11*b* is turned ON in accordance with the channel included in the multichannel audio data. Any one of the switches S11*c*, S11*d* is turned ON in accordance with the channel included in the multichannel audio data.

The switch S11*e* performs switching as to whether or not the surround rear right audio signal SBR is to be outputted to an amplifier 12*c*. The switch S11*f* performs switching as to whether or not the right outer audio signal RW is to be outputted to the amplifier 12*c*. The switch S11*g* performs switching as to whether or not the right upper audio signal RH is to be outputted to an amplifier 12*d*. The switch S11*h* performs switching as to whether or not the right outer audio signal RW is to be outputted to the amplifier 12*d*. Any one of the switches S11*e*, S11*f* is turned ON in accordance with the channel included in the multichannel audio data. Any one of the switches S11*g*, S11*h* is turned ON in accordance with the channel included in the multichannel audio data.

The pre-out unit 11 may not include the switches S11*a* to S11*h*, but the DSP may change the channels of the audio signals to be supplied to the amplifiers 12*a* to 12*d* in accordance with the channels included in the multichannel audio data.

The power amplifier 12 has the amplifiers 12*a* to 12*d*. The amplifier 12*a* amplifies the surround rear left audio signal SBL or the left outer audio signal LW supplied from the pre-out unit 11 to supply to the SP relay 13 (switches S13*a*, S13*b*). The amplifier 12*b* amplifies the left upper audio signal LH or the left outer audio signal LW supplied from the pre-out unit 11 to supply to the SP relay 13 (switches S13*c*, S13*d*). The amplifier 12*c* amplifies the surround rear right audio signal SBR or the right outer audio signal RW supplied from the pre-out unit 11 to supply to the SP relay 13 (switches S13*e*, S13*f*). The amplifier 12*d* amplifies the right upper audio signal RH or the right outer audio signal RW supplied from the pre-out unit 11 to supply to the SP relay 13 (switches S13*g*, S13*h*).

The SP relay 13 has the relay switches (hereinafter, referred to as switches) S13*a* to S13*h*. The switch S13*a* performs switching as to whether or not the surround rear left audio signal SBL supplied from the amplifier 12*a* is to be supplied to a surround rear left SP terminal 14*a*. The switch S13*b* performs switching as to whether or not the left outer audio signal LW supplied from the amplifier 12*a* is to be supplied to a left outer SP terminal 14*b*. The switch S13*c* performs switching as to whether or not the left outer audio signal LW supplied from the amplifier 12*b* is to be supplied to the left outer SP terminal 14*b*. The switch S13*d* performs switching as to whether or not the left upper audio signal LH supplied from the amplifier 12*b* is to be supplied to a left upper SP terminal 14*c*. The switches S13*a* to S13*d* are switched in accordance with the channels included in the multichannel audio data.

The switch S13*e* performs switching as to whether or not the surround rear right audio signal SBR supplied from the amplifier 12*c* is to be supplied to a surround rear right SP terminal 14*d*. The switch S13*f* performs switching as to whether or not the right outer audio signal RW supplied from the amplifier 12*c* is to be supplied to a right outer SP terminal 14*e*. The switch S13*g* performs switching as to whether or not the right outer audio signal RW supplied from the amplifier 12*d* is to be supplied to the right outer SP terminal 14*e*. The switch S13*h* performs switching as to whether or not the right upper audio signal RH supplied from the amplifier 12*d* is to be supplied to a right upper SP terminal 14*f*. The switches S13*e* to S13*h* are switched in accordance with the channels included in the multichannel audio data.

The SP terminal 14 has the SP terminals 14*a* to 14*f*. The surround rear left speaker SSBL is connected to the surround rear left SP terminal 14*a*. The left outer speaker SLW is connected to the left outer SP terminal 14*b*. The left upper speaker SLH is connected to the left upper SP terminal 14*c*. The surround rear right speaker SSBR is connected to the surround rear right SP terminal 14*d*. The right outer speaker SRW is connected to the right outer SP terminal 14*e*. The right upper speaker SRH is connected to the right upper SP terminal 14*f*.

Referring back to FIG. 2, the HDMI transmitting unit 4 converts the video data supplied from the HDMI receiving unit 3 to the HDMI data to transmit to the display apparatus 200.

The control unit 2 controls the respective units, based on an operation program of the AV amplifier stored in a memory not shown, which is built in or connected, and is, for example, a microcomputer, a CPU or the like. The control unit 2 determines the channels included in the multichannel audio data to control the switching of the switches S11*a* to S11*h*, S13*a* to S13*h* (the multichannel audio data is not limited to the audio data received from the BD player 100, but may be audio data outputted from the DSP). That is, if it is determined that the surround rear left audio signal SBL is included, the control unit 2 causes the switch S13*a* to supply the surround rear left audio signal SBL amplified by the amplifier 12*a* to the SP terminal 14*a*. If it is determined that the left outer audio signal LW is included, the control unit 2 causes the switch S13*b* to supply the left outer audio signal LW amplified by the amplifier 12*a* to the SP terminal 14*b*, or causes the switch S13*c* to supply the left outer audio signal LW amplified by the amplifier 12*b* to the SP terminal 14*b*. If it is determined that the left upper audio signal LH is included, the control unit 2 causes the switch S13*d* to supply the left upper audio signal LH amplified by the amplifier 12*b* to the SP terminal 14*c*. The foregoing is applied to the respective right signals.

The HDMI receiving unit 3 generates the original multichannel audio data from the HDMI data to supply to the audio processing unit 5. The audio processing unit 5 decodes the multichannel audio data to read channel information included in an information area thereof and supply the same to the control unit 2.

Figure 5:
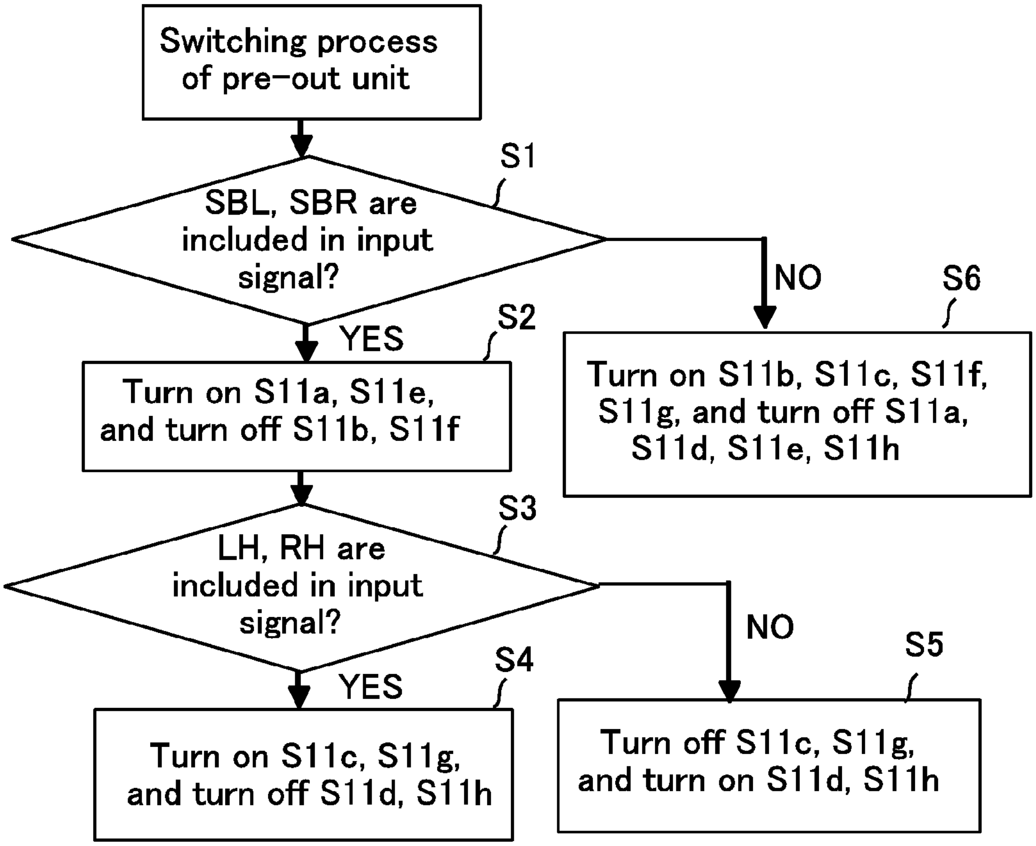
FIG. 5 is a flowchart showing processing of a control unit 2.

Hereinafter, operation of the present invention is described. FIG. 5 is a flowchart showing switching processing of the pre-out unit 11 by the control unit 2. The control unit 2 determines which (one or two) of combination of the surround rear left audio signal SBL and the surround rear right audio signal SBR, combination of the left upper audio signal LH and the right upper audio signal RH and combination of the left outer audio signal LW and the right outer audio signal RW is (are) included, based on the channel information of the input signals included in the multichannel audio data supplied from the audio processing unit 5.

First, the control unit 2 determines whether or not the combination of the surround rear left audio signal SBL and the surround rear right audio signal SBR is included (S1). If it is included (YES in S1), the control unit 2 controls the switches so as to supply the surround rear left audio signal SBL to the surround rear left SP terminal 14*a*, and to supply the surround rear right audio signal SBR to the surround rear right SP terminal 14*d*. That is, the control unit 2 controls the switches S11*a*, S11*e* to be in an ON state, and the switches S11*b*, S11*f* to be in an OFF state (S2).

Next, the control unit 2 further determines whether or not the combination of the left upper audio signal LH and the right upper audio signal RH is included in the multichannel audio data (S3). If it is included (YES in S3), the control unit 2 controls the switches so as to supply the left upper audio signal LH to the left upper SP terminal 14*c*, and to supply the right upper audio signal RH to the right upper SP terminal 14*f*. That is, the control unit 2 controls the switches S11*c*, S11*g* to be in an ON state, and the switches S11*d*, S11*h* to be in an OFF state (S4).

On the other hand, if the combination of the left upper audio signal LH and the right upper audio signal RH is not included in the multichannel audio data in S3, the control unit 2 controls the switches so as to supply the left outer audio signal LW to the left outer SP terminal 14*b*, and to supply the right outer audio signal RW to the right outer SP terminal 14*e*. That is, the control unit 2 controls the switches S11*d*, S11*h* to be in an ON state, and the switches S11*c*, S11*g* to be in an OFF state (S5).

If the combination of the surround rear left audio signal SBL and the surround rear right audio signal SBR is not included in the multichannel audio data in S1, the control unit 2 controls the switches so as to supply the left outer audio signal LW to the left outer SP terminal 14*b*, to supply the right outer audio signal RW to the right outer SP terminal 14*e*, to supply the left upper audio signal LH to the left upper SP terminal 14*c*, and to supply the right upper audio signal RH to the right upper SP terminal 14*f*. That is, the control unit 2 controls the switches S11*b*, S11*c*, S11*f*, S11*g* to be in an ON state, and the switches S11*a*, S11*d*, S11*e*, S11*h* to be in an OFF state (S6).

Figure 6:
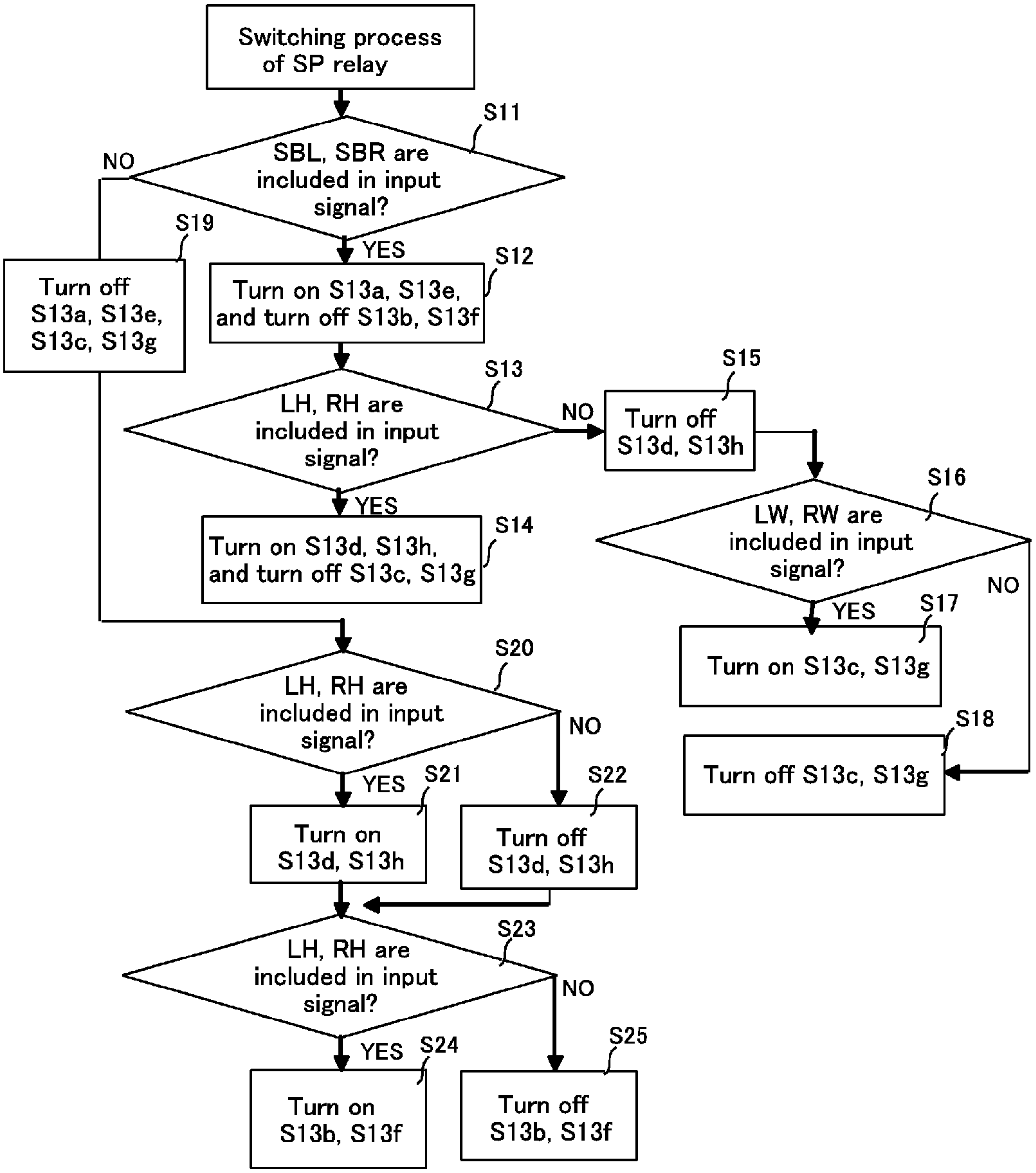
FIG. 6 is a flowchart showing the processing of the control unit 2.

FIG. 6 is a flowchart showing SP relay switching processing by the control unit 2. The control unit 2 determines whether or not the combination of the surround rear left audio signal SBL and the surround rear right audio signal SBR is included (S11). If it is included (YES in S11), the control unit 2 controls the switches so as to supply the surround rear left audio signal SBL to the surround rear left SP terminal 14*a*, and to supply the surround rear right audio signal SBR to the surround rear right SP terminal 14*d*. That is, the control unit 2 controls the switches S13*a*, S13*e* to be in an ON state, and the switches S13*b*, S13*f* to be in an OFF state (S12).

Next, the control unit 2 further determines whether or not the combination of the left upper audio signal LH and the right upper audio signal RH is included in the multichannel audio data (S13). If it is included (YES in S13), the control unit 2 controls the switches so as to supply the left upper audio signal LH to the left upper SP terminal 14*c*, and to supply the right upper audio signal RH to the right upper SP terminal 14*f*. That is, the control unit 2 controls the switches S13*d*, S13*h* to be in an ON state, and the switches S13*c*, S13*g* to be in an OFF state (S14).

On the other hand, if the combination of the left upper audio signal LH and the right upper audio signal RH is not included in S13, the control unit 2 controls the switches S13*d*, S13*h* to be in an OFF state so as not to supply the left upper audio signal LH to the left upper SP terminal 14*c*, and not to supply the right upper audio signal RH to the right upper SP terminal 14*f* (S15). The control unit 2 further determines whether or not the combination of the left outer audio signal LW and the right outer audio signal RW is included in the multichannel audio data (S16). If it is included (YES in S16), the control unit 2 controls the switches so as to supply the left outer audio signal LW to the left outer SP terminal 14*b*, and to supply the right outer audio signal RW to the right outer SP terminal 14*e*. That is, the control unit 2 controls the switches S13*c*, S13*g* to be in an ON state (S17).

If the combination of the left outer audio signal LW and the right outer audio signal RW is not included in S16, the control unit 2 controls the switches S13*c*, S13*g* to be in an OFF state so as not to supply the left outer audio signal LW to the left outer SP terminal 14*b*, and not to supply the right outer audio signal RW to the right upper SP terminal 14*e* (S18).

If the combination of the surround rear left audio signal SBL and the surround rear right audio signal SBR is not included in S11, the control unit 2 controls the switches S13*a*, S13*e* to be in an OFF state so as not to supply the surround rear left audio signal SBL to the surround rear left SP terminal 14*a*, and not to supply the surround rear right audio signal SBR to the surround rear right SP terminal 14*d* (S19). Furthermore, the control unit 2 controls the switches S13*c*, S13*g* to be in an OFF state (S19).

Next, the control unit 2 further determines whether or not the combination of the left upper audio signal LH and the right upper audio signal RH is included in the multichannel audio data (S20). If it is included (YES in S20), the control unit 2 controls the switches so as to supply the left upper audio signal LH to the left upper SP terminal 14*c*, and to supply the right upper audio signal RH to the right upper SP terminal 14*f*. That is, the control unit 2 controls the switches S13*d*, S13*h* to be in an ON state (S21).

On the other hand, if the combination of the left upper audio signal LH and the right upper audio signal RH is not included in S20, the control unit 2 controls the switches S13*d*, S13*h* to be in an OFF state so as not to supply the left upper audio signal LH to the left upper SP terminal 14*c*, and not to supply the right upper audio signal RH to the right upper SP terminal 14*f* (S22).

Next, the control unit 2 further determines whether or not the combination of the left outer audio signal LW and the right outer audio signal RW is included in the multichannel audio data (S23). If it is included (YES in S23), the control unit 2 controls the switches so as to supply the left outer audio signal LW to the left outer SP terminal 14*b*, and to supply the right outer audio signal RW to the right outer SP terminal 14*e*. That is, the control unit 2 controls the switches S13*b*, S13*f* to be in an ON state (S24).

If the combination of the left outer audio signal LW and the right outer audio signal RW is not included in S23, the control unit 2 controls the switches S13*b*, S13*f* to be in an OFF state so as not to supply the left outer audio signal LW to the left outer SP terminal 14*b*, and not to supply the right outer audio signal RW to the right outer SP terminal 14*e* (S25).

As described above, only the two amplifiers 12*a*, 12*b* are provided, by which the audio signals of the two channels arbitrarily selected from the surround rear left audio signal SBL, the left outer audio signal LW and the left upper audio signal LH can be amplified to be outputted to the SP terminals corresponding to these channels. Moreover, only the two amplifiers 12*c*, 12*d* are provided, by which the audio signals of the two channels arbitrarily selected from the surround rear right audio signal SBR, the right outer audio signal RW and the right upper audio signal RH can be amplified to be outputted to the SP terminals corresponding to these channels. It is because the audio signals of the three channels of the surround rear left audio signal SBL, the left outer audio signal LW, and the left upper audio signal LH are not simultaneously included in the audio formats relating to HD (High Definition) such as Dolby True HD, Dolby Digital Plus, DTS-HD and the like, and the audio signals of the three channels of the surround rear right audio signal SBR, the right outer audio signal RW, and the right upper audio signal RH are not simultaneously included therein that the above-described processing is enabled.

If the surround rear left audio signal SBL, the left outer audio signal LW, and the left upper audio signal LH are simultaneously included, the audio signals of the two channels set by user operation in advance may be amplified to be outputted to the SP terminals of the respective channels. Similarly, if the surround rear right audio signal SBR, the right outer audio signal RW, and the right upper audio signal RH are simultaneously included, the audio signals of the two channels set by user operation in advance may be amplified to be outputted to the SP terminals of the respective channels.

Moreover, while in the above-described flowchart, if the surround rear left audio signal SBL, the left outer audio signal LW, and the left upper audio signal LH are simultaneously included, processing of selecting the surround rear left audio signal SBL and the left upper audio signal LH is performed in default, the present invention is not limited thereto, but the flowchart may be configured so that the left outer audio signal LW is selected. Similarly, while if the surround rear right audio signal SBR, the right outer audio signal RW, and the right upper audio signal RH are simultaneously included, processing of selecting the surround rear right audio signal SBR and the right upper audio signal RH is performed in default, the present invention is not limited thereto, but the flowchart may be configured so that the right outer audio signal RW is selected.

Figure 7:
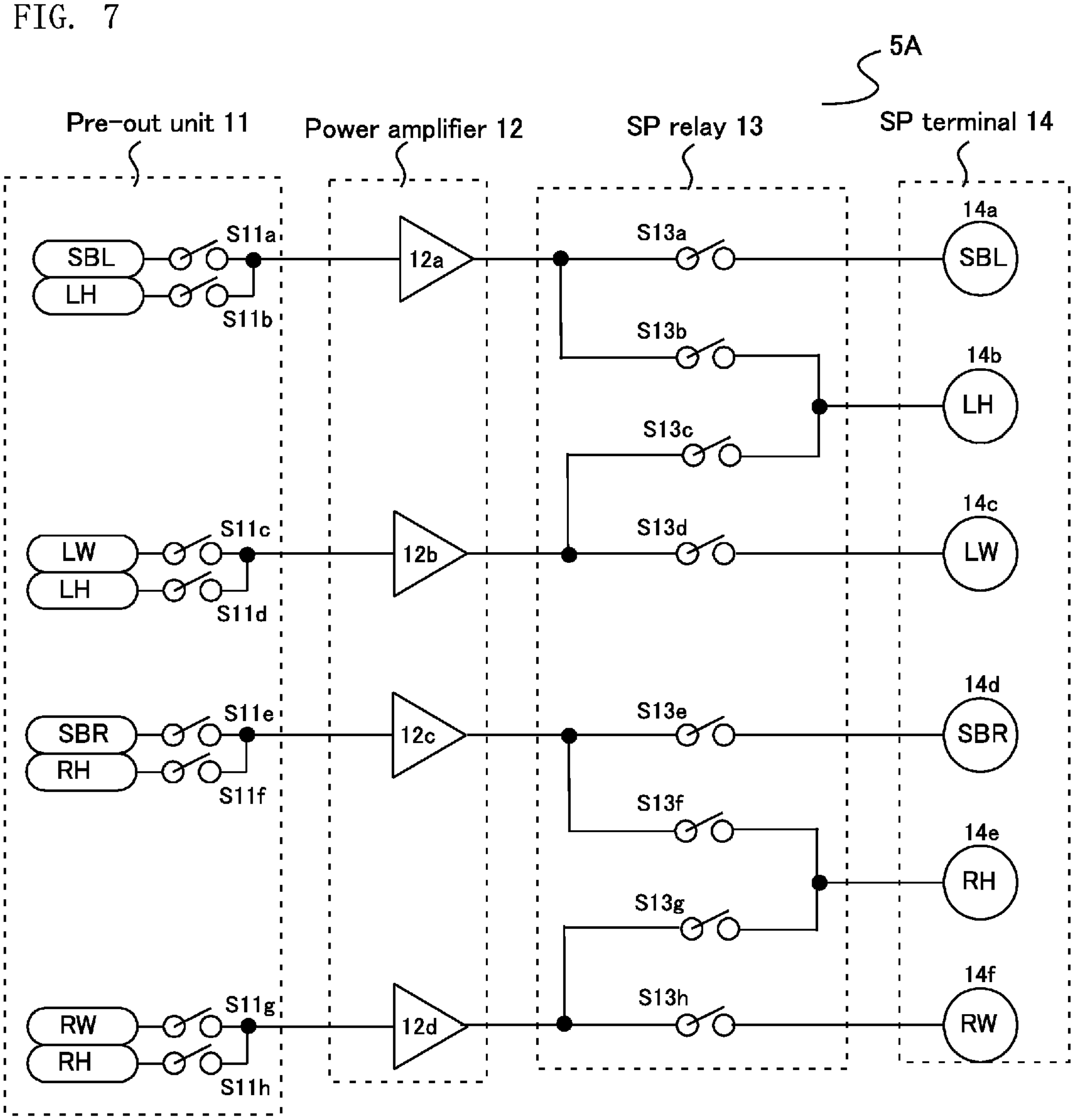
FIG. 7 is a diagram showing an audio processing unit 5A.

Next, another preferred embodiment of the present invention is described. As shown in FIG. 7, in the embodiment, a circuit configuration may be employed, in which the left outer audio signal LW is replaced by the left upper audio signal LH, and the right outer audio signal RW is replaced by the right upper audio signal RH.

Figure 8:
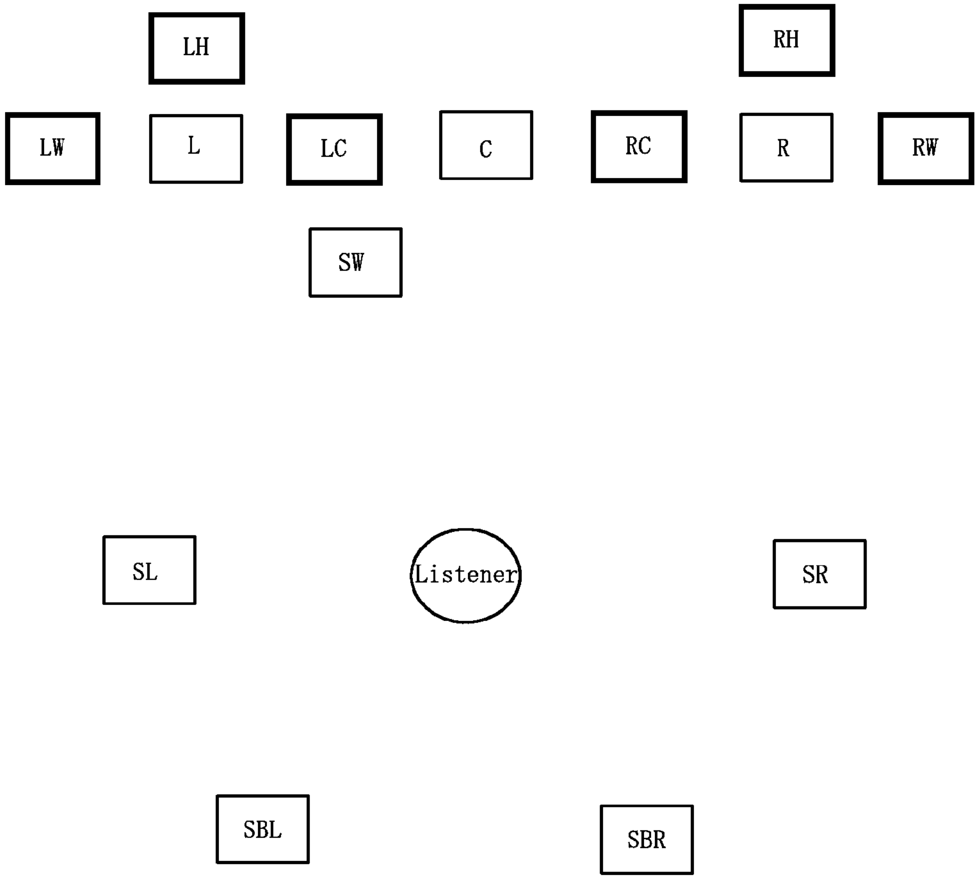
FIG. 8 is a diagram showing channels of audio signals.
Figure 9:
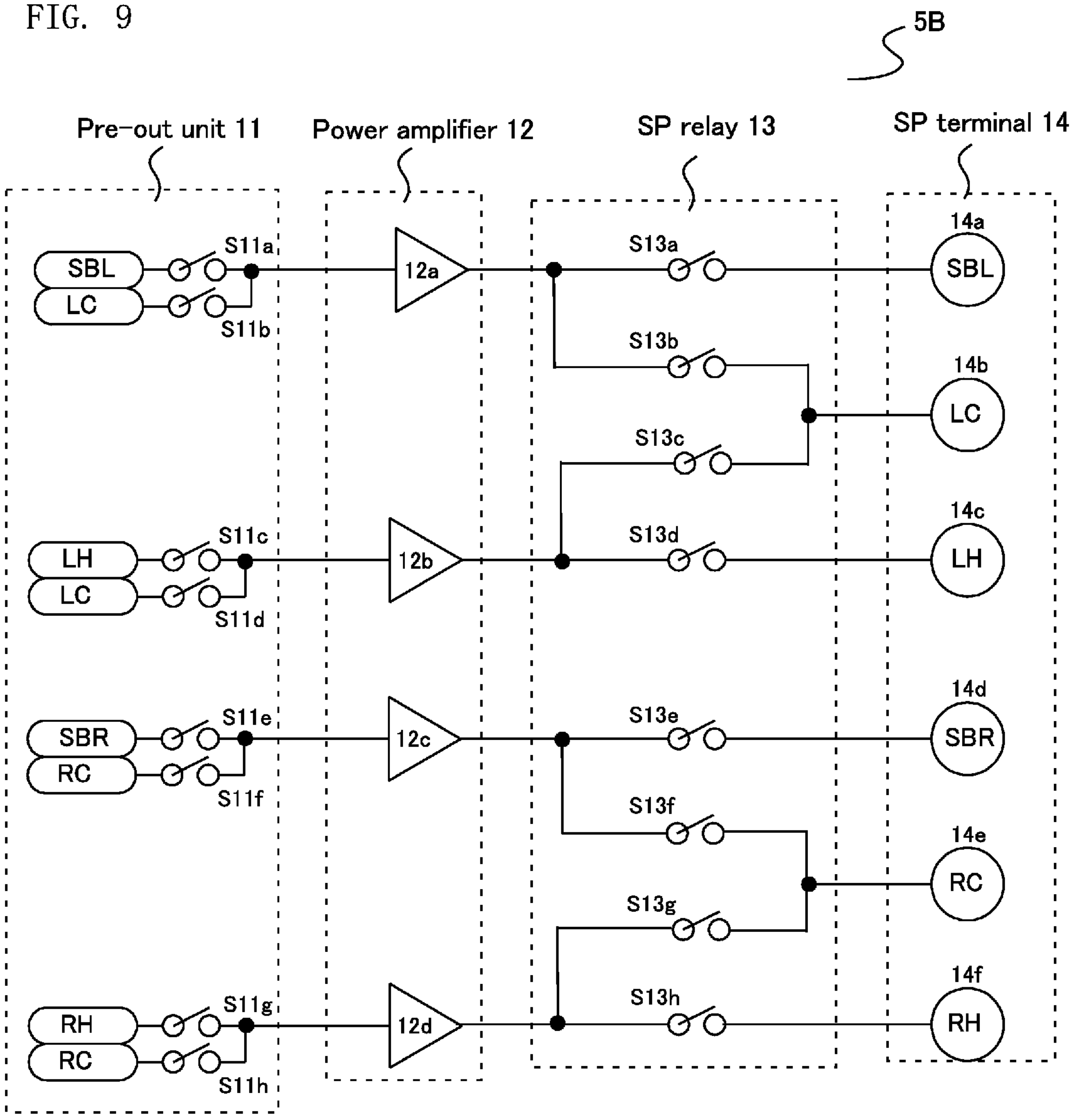
FIG. 9 is a diagram showing an audio processing unit 5B.

Next, another preferred embodiment of the present invention is described. As shown in FIG. 8, in the embodiment, in place of (or in addition to) the left outer audio signal LW, a left central audio signal LC exists, and in place of (or in addition to) the right outer audio signal RW, a right central audio signal RC exists. The left central audio signal LC is an audio signal reproduced at a position between the left audio signal L and the central audio signal C. The right central audio signal RC is an audio signal reproduced at a position between the right audio signal R and the central audio signal C. In this case, as shown in FIG. 9, a circuit configuration may be employed in which the left outer audio signal LW is replaced by the left central audio signal LC, and the right outer audio signal RW is replaced by the right central audio signal RC.

When the above-described embodiments are generally expressed in light of the foregoing, the surround rear left audio signal SBL is defined as a first extended left audio signal, the surround rear right audio signal SBR is defined as a first extended right audio signal, the left outer audio signal LW is defined as a second extended left audio signal, the right outer audio signal RW is defined as a second extended right audio signal, the left upper audio signal LH is defined as a third extended left audio signal, and the right upper audio signal RH is defined as a third extended right audio signal.

The first extended left audio signal may be any of the surround rear left audio signal SBL, the left outer audio signal LW, the left upper audio signal LH, and the left central audio signal LC. The second extended left audio signal may be any one of the surround rear left audio signal SBL, the left outer audio signal LW, the left upper audio signal LH, and the left central audio signal LC, and may be a channel different from that of the first extended left audio signal. The third extended left audio signal may be any of the surround rear left audio signal SBL, the left outer audio signal LW, the left upper audio signal LH, and the left central audio signal LC, and may be an audio signal of a channel different from those of the first extended left audio signal and the second extended left audio signal.

Similarly, the first extended right audio signal may be any of the surround rear right audio signal SBR, the right outer audio signal RW, the right upper audio signal RH, and the right central audio signal RC. The second extended right audio signal may be any of the surround rear right audio signal SBR, the right outer audio signal RW, the right upper audio signal RH, and the right central audio signal RC, and may be an audio signal of a channel different from that of the first extended right audio signal. The third extended right audio signal may be any of the surround rear right audio signal SBR, the right outer audio signal RW, the right upper audio signal RH, and the right central audio signal RC, and may be an audio signal of a channel different from those of the first extended right audio signal and the second extended right audio signal.

Moreover, what is minimum required for the present invention is at least one of the configuration in which one or two audio signals selected from the first extended left audio signal, the second extended left audio signal, and the third extended left audio signal is (are) amplified, and the configuration in which one or two audio signals selected from the first extended right audio signal, the second extended right audio signal and the third extended right audio signal is (are) amplified. That is, not both the configuration in which the one or two audio signals selected from the first extended left audio signal, the second extended left audio signal and the third extended left audio signal is (are) amplified, and the configuration in which the one or two audio signals selected from first extended right audio signal, the second extended right audio signal and the third extended right audio signal is (are) amplified need to be included.

For example, in the case where only the configuration is included, in which the one or two audio signals selected from the first extended left audio signal, the second extended left audio signal and the third extended left audio signal is (are) amplified, the processing of determining whether or not the combination of the surround rear left audio signal SBL and the surround rear right audio signal SBR is included in each of the above-described flowcharts is changed to processing of determining whether or not the surround rear left audio signal SBL is included. The processing of determining whether or not the combination of the left upper audio signal LH and the right upper audio signal RH is included is changed to processing of determining whether or not the left upper audio signal LH is included. The processing of determining whether or not the combination of the left outer audio signal LW and the right outer audio signal RW is included is changed to processing of determining whether or not the left outer audio signal LW is included.

Figure 10:
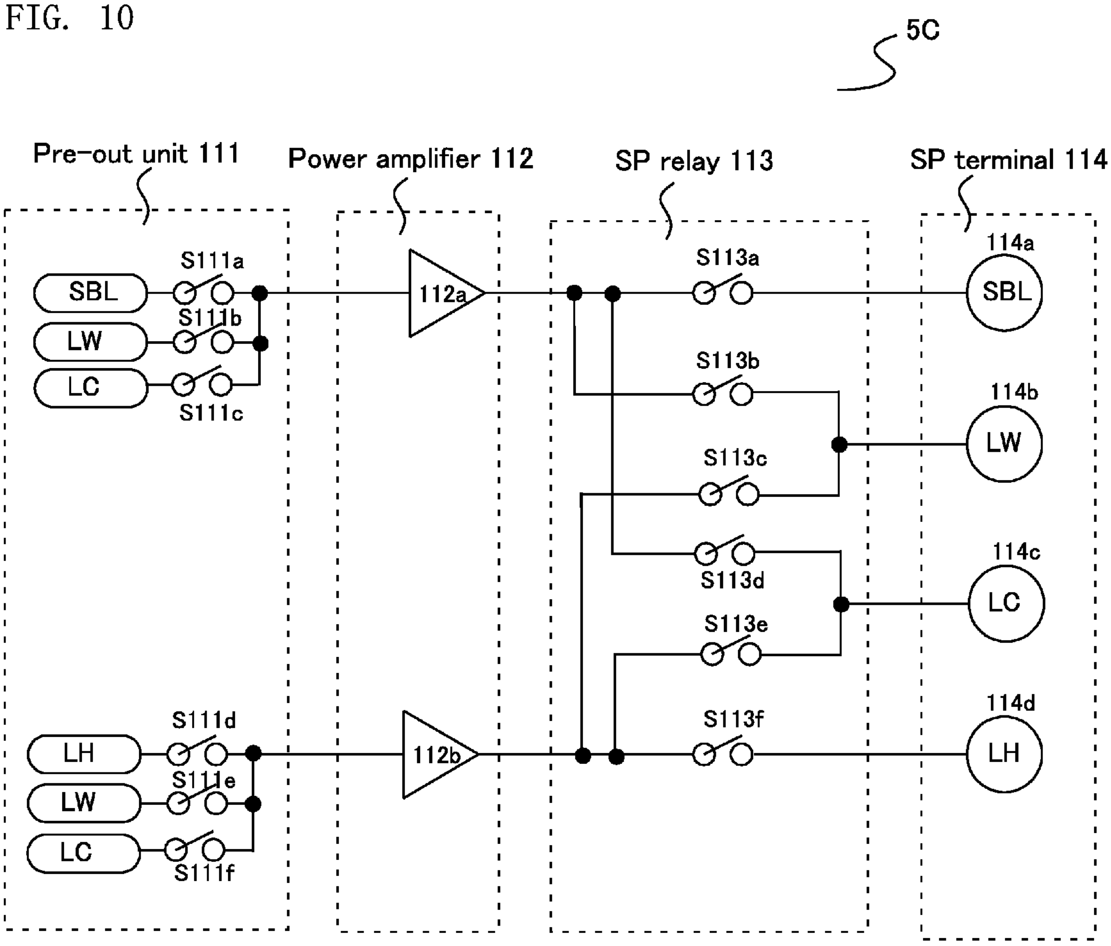
FIG. 10 is a diagram showing an audio processing unit 5C.

Next, still another embodiment of the present invention is described. FIG. 10 shows an audio processing unit 5C of the present embodiment. In the present embodiment, while for brief explanation, only the left channels are described, the right channels are similar. A pre-out unit 111 has switches S111*a* to S111*f*. The switch S111*a* performs switching as to whether or not the surround rear left audio signal SBL is to be outputted to an amplifier 112*a*. The switch S111*b* performs switching as to whether or not the left outer audio signal LW is to be outputted to the amplifier 112*a*. The switch S111*c* performs switching as to whether or not the left central audio signal LC is to be outputted to the amplifier 112*a*. The switch S111*d* performs switching as to whether or not the left upper audio signal LH is to be outputted to an amplifier 112*b*. The switch S111*e* performs switching as to whether or not the left outer audio signal LW is to be outputted to the amplifier 112*b*. The switch S111*f* performs switching as to whether or not the left central audio signal LC is to be outputted to the amplifier 112*b*. Any one of the switches S111*a* to S111*c* is turned ON in accordance with the channel included in the multichannel audio data. Any one of the switches S111$d$ to S111$f$ is turned ON in accordance with the channel included in the multichannel audio data.

The pre-out unit 111 may not include the switches S111$a$ to S111$f$, but the DSP may change the channels of the audio signals to be supplied to the amplifiers 112$a$, 112$b$ in accordance with the channels included in the multichannel audio data.

A power amplifier 112 has the amplifiers 112$a$, 112$b$. The amplifier 112$a$ amplifies the surround rear left audio signal SBL, the left outer audio signal LW or the left central audio signal LC supplied from the pre-out unit 111 to supply to a SP relay 113 (switches S113$a$, S113$b$, S113$d$). The amplifier 112$b$ amplifies the left upper audio signal LH, the left outer audio signal LW or the left central audio signal LC supplied from the pre-out unit 111 to supply to the SP relay 113 (switches S113$c$, S113$e$, S113$f$).

The SP relay 113 has the relay switches (hereinafter, referred to as switches) S113$a$ to S113$f$. The switch S113$a$ performs switching as to whether or not the surround rear left audio signal SBL supplied from the amplifier 112$a$ is to be supplied to a surround rear left SP terminal 114$a$. The switch S113$b$ performs switching as to whether or not the left outer audio signal LW supplied from the amplifier 112$a$ is to be supplied to a left outer SP terminal 114$b$. The switch S113$c$ performs switching as to whether or not the left outer audio signal LW supplied from the amplifier 112$b$ is to be supplied to the left outer SP terminal 114$b$. The switch S113$d$ performs switching as to whether or not the left central audio signal LC supplied from the amplifier 112$a$ is to be supplied to a left central SP terminal 114$c$. The switch S113$e$ performs switching as to whether or not the left central audio signal LC supplied from the amplifier 112$b$ is to be supplied to the left central SP terminal 114$c$. The switch S113$f$ performs switching as to whether or not the left upper audio signal LH supplied from the amplifier 112$b$ is to be supplied to a left upper SP terminal 114$d$. The switches S113$a$ to S113$f$ are switched in accordance with the channels included in the multichannel audio data.

A SP terminal 114 has the SP terminals 114$a$ to 114$d$. The surround rear left speaker SSBL is connected to the surround rear left SP terminal 114$a$. The left outer speaker SLW is connected to the left outer SP terminal 114$b$. The left central speaker SLC is connected to the left central SP terminal 114$c$. The left upper speaker SLH is connected to the left upper SP terminal 114$d$.

Figure 11:
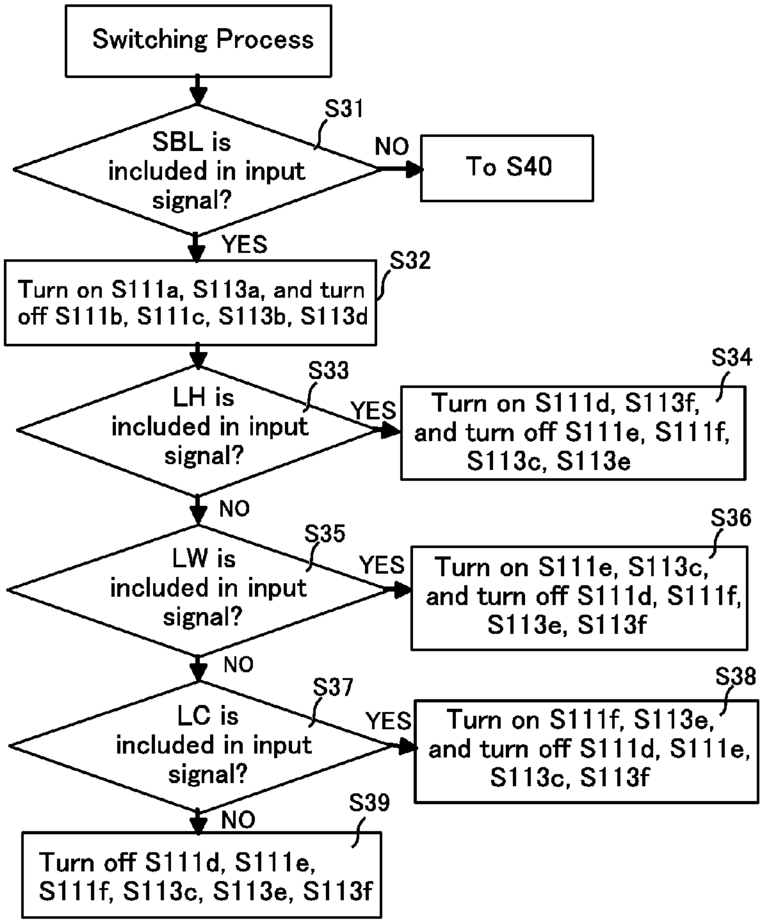
FIG. 11 is a flowchart showing processing of the control unit 2.
Figure 12:
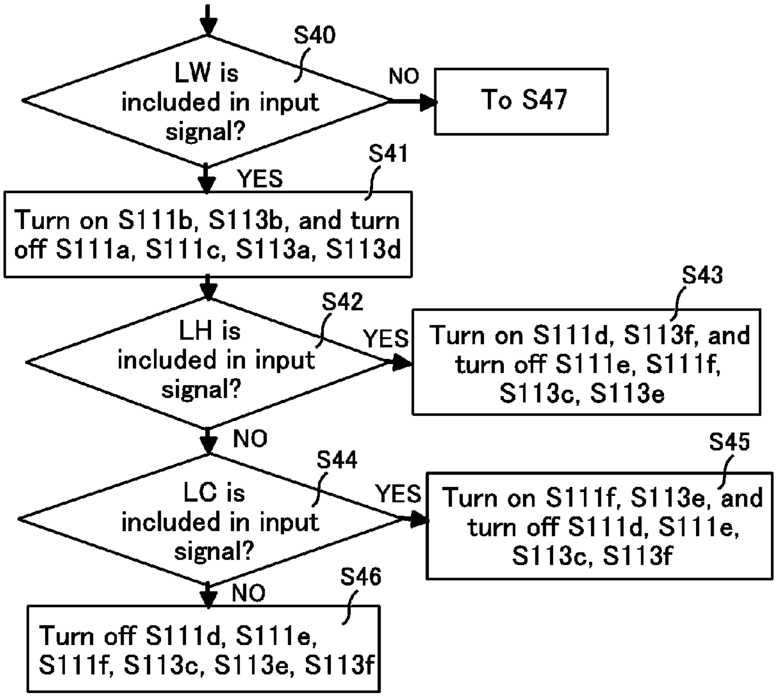
FIG. 12 is a flowchart showing the processing of the control unit 2.
Figure 13:
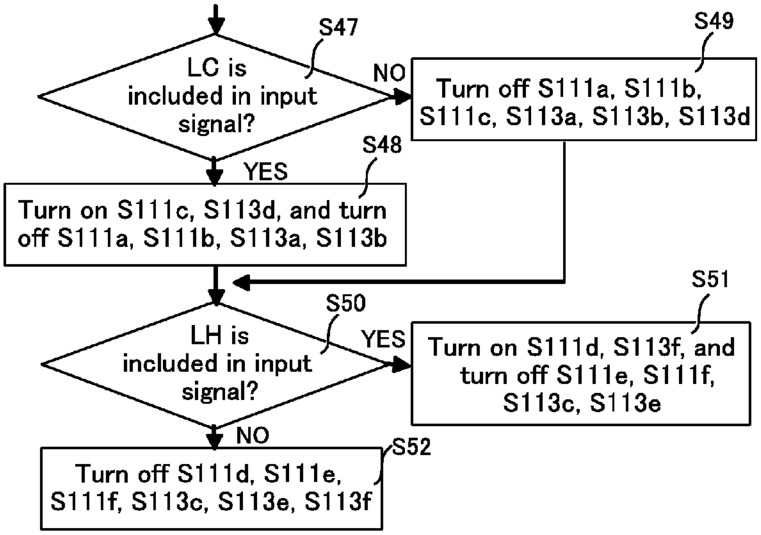
FIG. 13 is a flowchart showing the processing of the control unit 2.

FIGS. 11 to 13 are flowcharts showing operation of the present embodiment. The control unit 2 determines whether or not the surround rear left audio signal SBL is included in the multichannel audio data (S31). If it is included (YES in S31), the control unit 2 controls the switches so as to supply the surround rear left audio signal SBL to the surround rear left SP terminal 114$a$. That is, the control unit 2 controls the switches S111$a$, S113$a$ to be in an ON state, and the switches S111$b$, S111$c$, S113$b$, S113$d$ to be in an OFF state (S32).

The control unit 2 determines whether or not the left upper audio signal LH is included in the multichannel audio data (S33). If it is included (YES in S33), the control unit 2 controls the switches so as to supply the left upper audio signal LH to the left upper SP terminal 114$d$. That is, the control unit 2 controls the switches S111$d$, S113$f$ to be in an ON state, and the switches S111$e$, S111$f$, S113$c$, S113$e$ to be in an OFF state (S34).

If the left upper audio signal LH is not included (NO in S33), the control unit 2 determines whether or not the left outer audio signal LW is included in the multichannel audio data (S35). If it is included (YES in S35), the control unit 2 controls the switches so as to supply the left outer audio signal LW to the left outer SP terminal 114$b$. That is, the control unit 2 controls the switches S111$e$, S113$c$ to be in an ON state, and the switches S111$d$, S111$f$, S113$e$, S113$f$ to be in an OFF state (S36).

If the left outer audio signal LW is not included (NO in S35), the control unit 2 determines whether or not the left central audio signal LC is included in the multichannel audio data (S37). If it is included (YES in S37), the control unit 2 controls the switches so as to supply the left central audio signal LC to the left central SP terminal 114$c$. That is, the control unit 2 controls the switches S111$f$, S113$e$ to be in an ON state, and the switches S111$d$, S111$e$, S113$c$, S113$f$ to be in an OFF state (S38). If the left central audio signal LC is not included (NO in S37), the control unit 2 controls the switches S111$d$, S111$e$, S111$f$, S113$c$, S113$e$, S113$f$ to be in an OFF state (S39).

When the surround rear left audio signal SBL is not included in S31 (NO in S31), as shown in FIG. 12, the control unit 2 determines whether or not the left outer audio signal LW is included in the multichannel audio data (S40). If it is included (YES in S40), the control unit 2 controls the switches so as to supply the left outer audio signal LW to the left outer SP terminal 114$b$. That is, the control unit 2 controls the switches S111$b$, S113$b$ to be in an ON state, and the switches S111$a$, S111$c$, S113$a$, S113$d$ to be in an OFF state (S41).

The control unit 2 determines whether or not the left upper audio signal LH is included in the multichannel audio data (S42). If it is included (YES in S42), the control unit 2 controls the switches so as to supply the left upper audio signal LH to the left upper SP terminal 114$d$. That is, the control unit 2 controls the switches S111$d$, S113$f$ to be in an ON state, and the switches S111$e$, S111$f$, S113$c$, S113$e$ to be in an OFF state (S43).

If the left upper audio signal LH is not included (NO in S42), the control unit 2 determines whether or not the left central audio signal LC is included in the multichannel audio data (S44). If it is included (YES in S44), the control unit 2 controls the switches so as to supply the left central audio signal LC to the left central SP terminal 114$c$. That is, the control unit 2 controls the switches S111$f$, S113$e$ to be in an ON state, and the switches S111$d$, S111$e$, S113$c$, S113$f$ to be in an OFF state (S45). If the left central audio signal LC is not included (NO in S44), the control unit 2 controls the switches S111$d$, S111$e$, S111$f$, S113$c$, S113$e$, S113$f$ to be in an OFF state (S46).

When the left outer audio signal LW is not included in S40 (NO in S40), as shown in FIG. 13, the control unit 2 determines whether or not the left central audio signal LC is included in the multichannel audio data (S47). If it is included (YES in S47), the control unit 2 controls the switches so as to supply the left central audio signal LC to the left central SP terminal 114$c$. That is, the control unit 2 controls the switches S111$c$, S113$d$ to be in an ON state, and the switches S111$a$, S111$b$, S113$a$, S113$b$ to be in an OFF state (S48). If the left central audio signal LC is not included (NO in S47), the control unit 2 controls the switches S111$a$, S111$b$, S111$c$, S113$a$, S113$b$, S113$d$ to be in an OFF state (S49).

The control unit 2 determines whether or not the left upper audio signal LH is included in the multichannel audio data (S50). If it is included (YES in S50), the control unit 2 controls the switches so as to supply the left upper audio signal LH to the left upper SP terminal 114$d$. That is, the control unit 2 controls the switches S111$d$, S113$f$ to be in an ON state, and the switches S111$e$, S111$f$, S113$c$, S113$e$ to be in an OFF state (S51). If the left upper audio signal LH is not included (NO in S50), the control unit 2 controls the switches S111*d*, S111*e*, S111*f*, S113*c*, S113*e*, S113*f* to be in an OFF state (S52).

Figure 14:
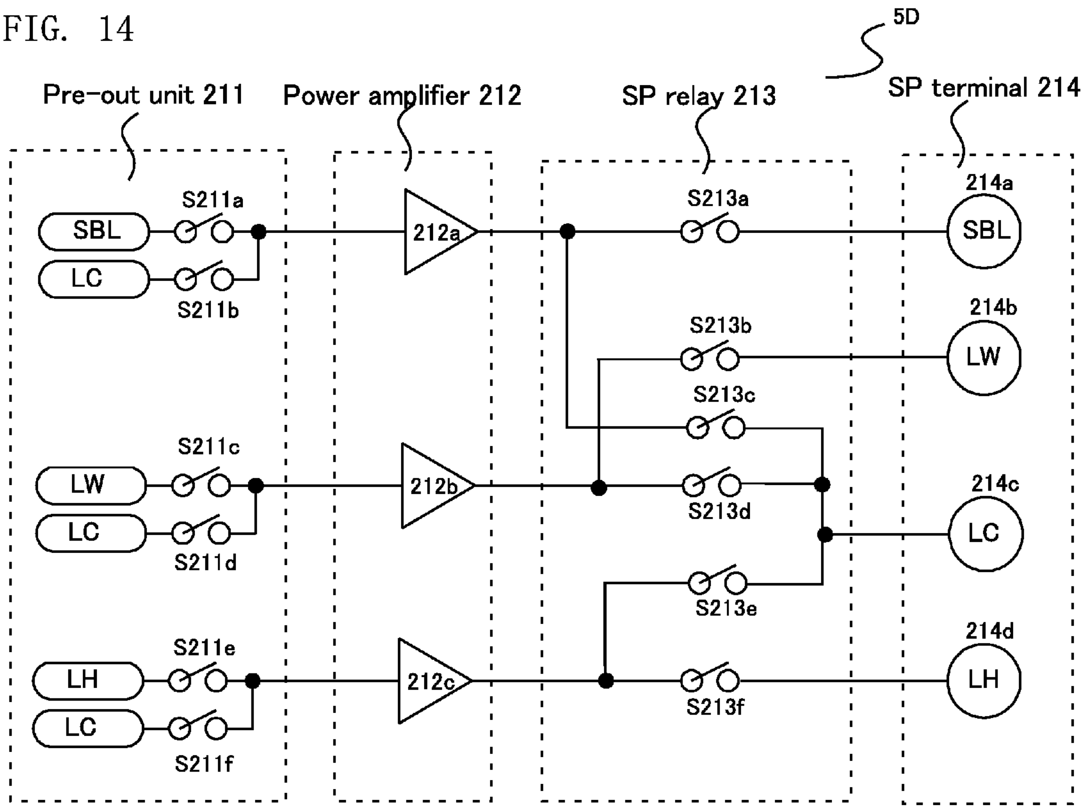
FIG. 14 is a diagram showing an audio processing unit 5D.

Next, still another embodiment of the present invention is described. FIG. 14 shows an audio processing unit 5D of the present embodiment. In the present embodiment, while for brief explanation, only the left channels are described, the right channels are similar. A pre-out unit 211 has switches S211*a* to S211*f*. The switch S211*a* performs switching as to whether or not the surround rear left audio signal SBL is to be outputted to an amplifier 212*a*. The switch S211*b* performs switching as to whether or not the left central audio signal LC is to be outputted to the amplifier 212*a*. The switch S211*c* performs switching as to whether or not the left outer audio signal LW is to be outputted to an amplifier 212*b*. The switch S211*d* performs switching as to whether or not the left central audio signal LC is to be outputted to the amplifier 212*b*. The switch S211*e* performs switching as to whether or not the left upper audio signal LH is to be outputted to an amplifier 212*c*. The switch S211*f* performs switching as to whether or not the left central audio signal LC is to be outputted to the amplifier 212*c*.

A pre-out unit 211 may not include the switches S211*a* to S211*f*, but the DSP may change the channels of the audio signals to be supplied to the amplifiers 212*a* to 212*c* in accordance with the channels included in the multichannel audio data.

A power amplifier 212 has the amplifiers 212*a*, 212*b*, 212*c*. The amplifier 212*a* amplifies the surround rear left audio signal SBL or the left central audio signal LC supplied from the pre-out unit 211 to supply to a SP relay 213 (switches S213*a*, S213*c*). The amplifier 212*b* amplifies the left outer audio signal LW or the left central audio signal LC supplied from the pre-out unit 211 to supply to the SP relay 213 (switches S213*b*, S213*d*). The amplifier 212*c* amplifies the left upper audio signal LH or the left central audio signal LC supplied from the pre-out unit 211 to supply to the SP relay 213 (switches S213*e*, S213*f*).

The SP relay 213 has the relay switches (hereinafter, referred to as switches) S213*a* to S213*f*. The switch S213*a* performs switching as to whether or not the surround rear left audio signal SBL supplied from the amplifier 212*a* is to be supplied to a surround rear left SP terminal 214*a*. The switch S213*b* performs switching as to whether or not the left outer audio signal LW supplied from the amplifier 212*b* is to be supplied to a left outer SP terminal 214*b*. The switch S213*c* performs switching as to whether or not the left central audio signal LC supplied from the amplifier 212*a* is to be supplied to a left central SP terminal 214*c*. The switch S213*d* performs switching as to whether or not the left central audio signal LC supplied from the amplifier 212*b* is to be supplied to the left central SP terminal 214*c*. The switch S213*e* performs switching as to whether or not the left central audio signal LC supplied from the amplifier 212*c* is to be supplied to the left central SP terminal 214*c*. The switch S213*f* performs switching as to whether or not the left upper audio signal LH supplied from the amplifier 212*c* is to be supplied to a left upper SP terminal 214*d*.

Figure 15:
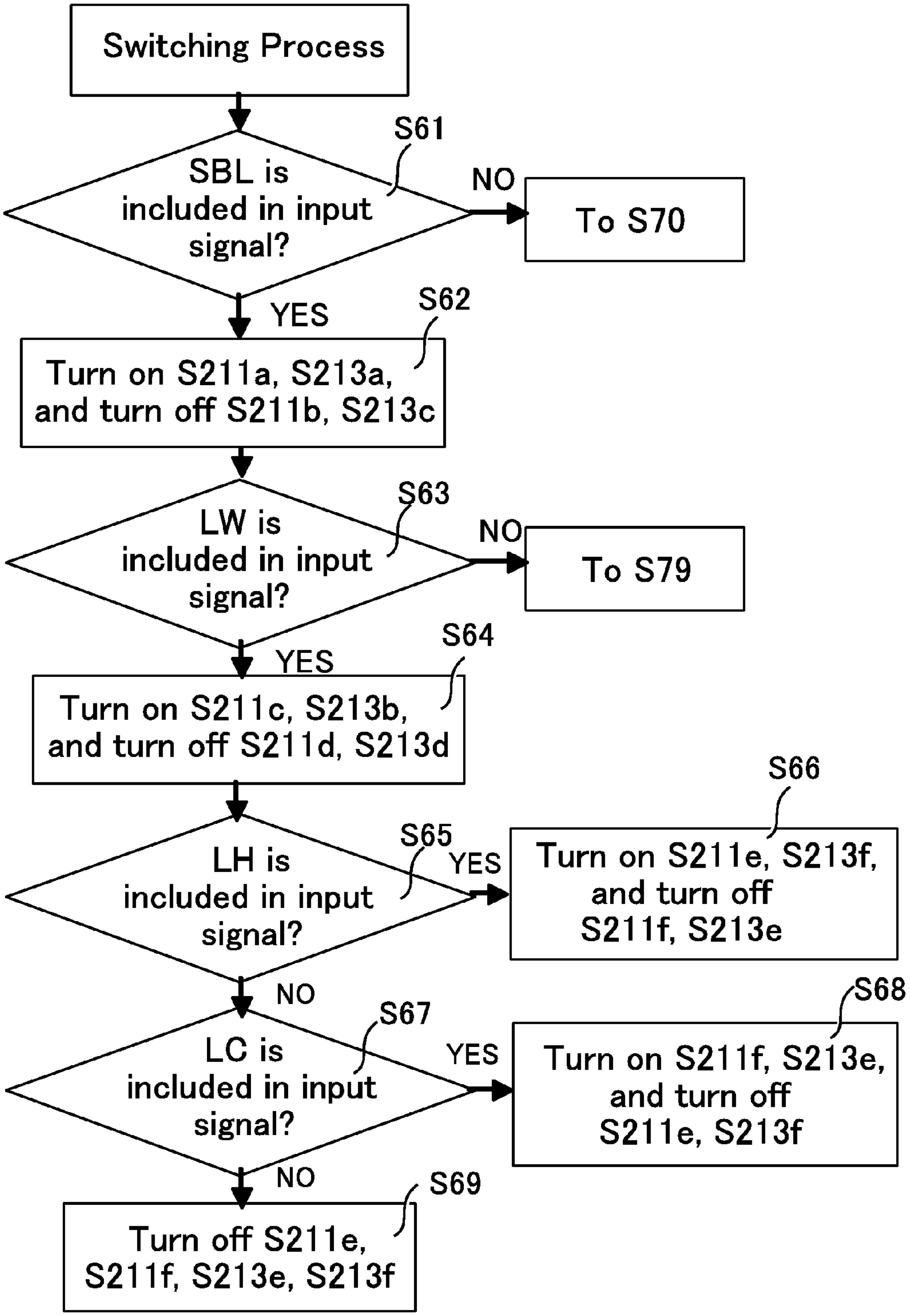
FIG. 15 is a flowchart showing processing of the control unit 2.
Figure 16:
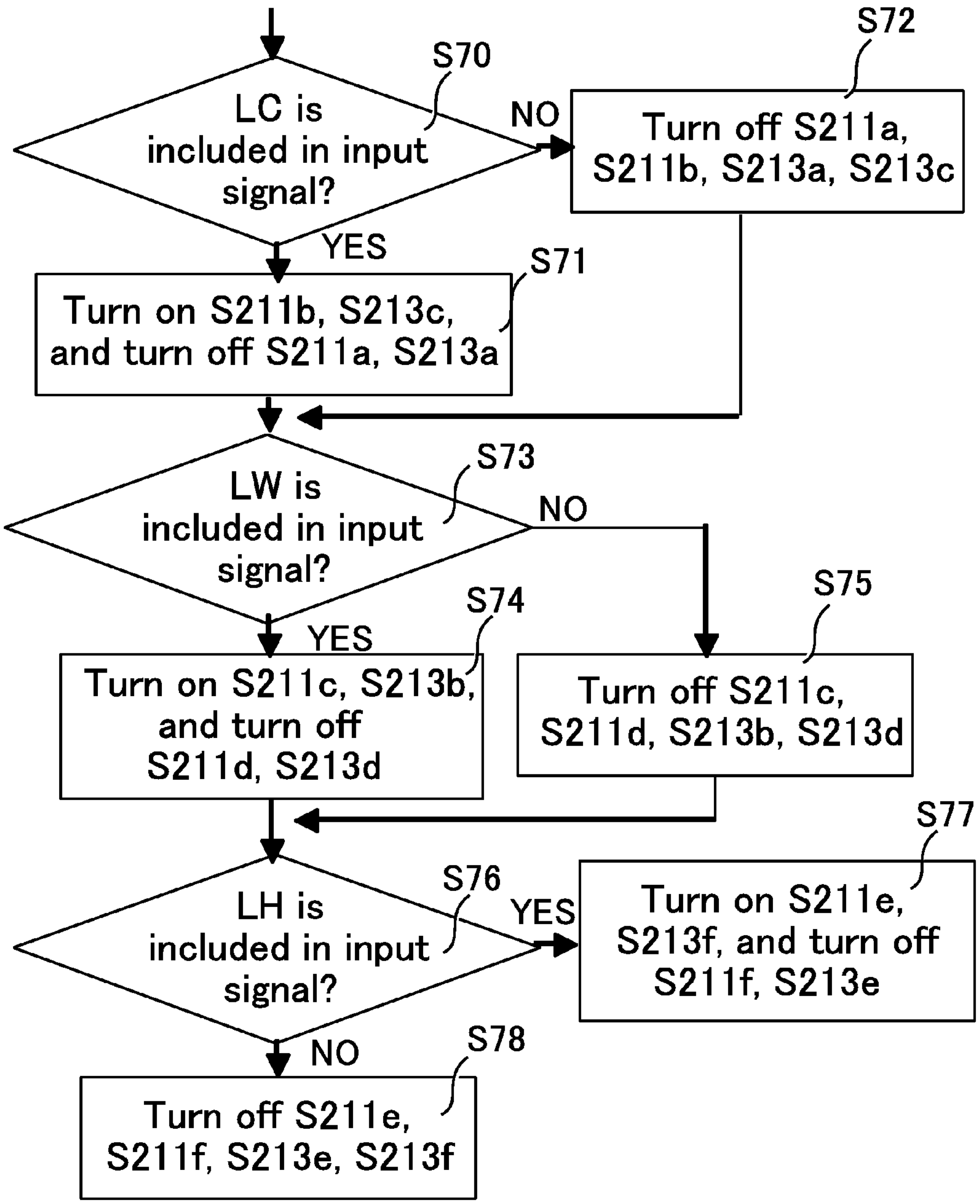
FIG. 16 is a flowchart showing the processing of the control unit 2.
Figure 17:
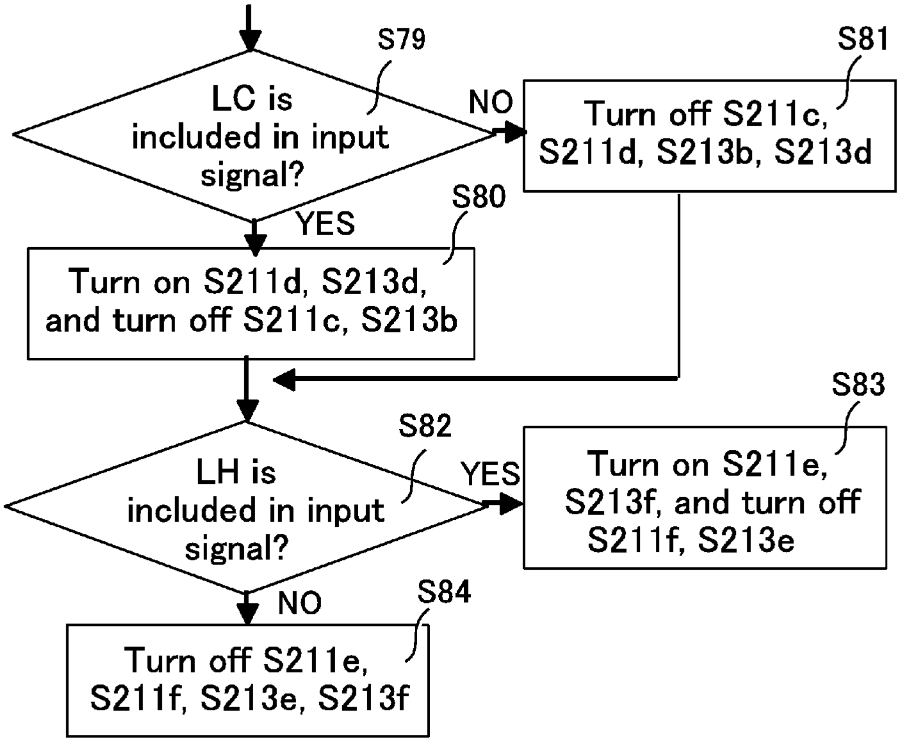
FIG. 17 is a flowchart showing the processing of the control unit 2.

FIGS. 15 to 17 are flowcharts showing operation of the present embodiment. The control unit 2 determines whether or not the surround rear left audio signal SBL is included in the multichannel audio data (S61). If it is included (YES in S61), the control unit 2 controls the switches so as to supply the surround rear left audio signal SBL to the surround rear left SP terminal 214*a*. That is, the control unit 2 controls the switches S211*a*, S213*a* to be in an ON state, and the switches S211*b*, S213*c* to be in an OFF state (S62).

The control unit 2 determines whether or not the left outer audio signal LW is included in the multichannel audio data (S63). If it is included (YES in S63), the control unit 2 controls the switches so as to supply the left outer audio signal LW to the left outer SP terminal 214*b*. That is, the control unit 2 controls the switches S211*c*, S213*b* to be in an ON state, and the switches S211*d*, S213*d* to be in an OFF state (S64).

The control unit 2 determines whether or not the left upper audio signal LH is included in the multichannel audio data (S65). If it is included (YES in S65), the control unit 2 controls the switches so as to supply the left upper audio signal LH to the left upper SP terminal 214*d*. That is, the control unit 2 controls the switches S211*e*, S213*f* to be in an ON state, and the switches S211*f*, S213*e* to be in an OFF state (S66).

If the left upper audio signal LH is not included (NO in S65), the control unit 2 determines whether or not the left central audio signal LC is included in the multichannel audio data (S67). If it is included (YES in S67), the control unit 2 controls the switches so as to supply the left central audio signal LC to the left central SP terminal 214*c*. That is, the control unit 2 controls the switches S211*f*, S213*e* to be in an ON state, and the switches S211*e*, S213*f* to be in an OFF state (S68). If the left central audio signal LC is not included (NO in S67), the control unit 2 controls the switches S211*e*, S211*f*, S213*e*, S213*f* to be in an OFF state (S69).

If the surround rear left audio signal SBL is not included in S61 (NO in S61), as shown in FIG. 16, the control unit 2 determines whether or not the left central audio signal LC is included in the multichannel audio data (S70). If it is included (YES in S70), the control unit 2 controls the switches so as to supply the left central audio signal LC to the left central SP terminal 214*c*. That is, the control unit 2 controls the switches S211*b*, S213*c* to be in an ON state, and the switches S211*a*, S213*a* to be in an OFF state (S71). On the other hand, if the left central audio signal LC is not included (NO in S70), the control unit 2 controls the switches S211*a*, S211*b*, S213*a*, S213*c* to be in an OFF state (S72).

The control unit 2 determines whether or not the left outer audio signal LW is included in the multichannel audio data (S73). If it is included (YES in S73), the control unit 2 controls the switches so as to supply the left outer audio signal LW to the left outer SP terminal 214*b*. That is, the control unit 2 controls the switches S211*c*, S213*b* to be in an ON state, and the switches S211*d*, S213*d* to be in an OFF state (S74). If the left outer audio signal LW is not included (NO in S73), the control unit 2 controls the switches S211*c*, S211*d*, S213*b*, S213*d* to be in an OFF state (S75).

The control unit 2 determines whether or not the left upper audio signal LH is included in the multichannel audio data (S76). If it is included (YES in S76), the control unit 2 controls the switches so as to supply the left upper audio signal LH to the left upper SP terminal 214*d*. That is, the control unit 2 controls the switches S211*e*, S213*f* to be in an ON state, and the switches S211*f*, S213*e* to be in an OFF state (S77). If the left upper audio signal LH is not included (NO in S76), the control unit 2 controls the switches S211*e*, S211*f*, S213*e*, S213*f* to be in an OFF state (S78).

If the left outer audio signal LW is not included in S63 (NO in S63), as shown in FIG. 17, the control unit 2 determines whether or not the left central audio signal LC is included in the multichannel audio data (S79). If it is included (YES in S79), the control unit 2 controls the switches so as to supply the left central audio signal LC to the left central SP terminal 214*c*. That is, the control unit 2 controls the switches S211*d*, S213*d* to be in an ON state, and the switches S211*c*, S213*b* to be in an OFF state (S80). On the other hand, if the left central audio signal LC is not included (NO in S79), the control unit 2 controls the switches S211*c*, S211*d*, S213*b*, S213*d* to be in an OFF state (S81).

The control unit 2 determines whether or not the left upper audio signal LH is included in the multichannel audio data (S82). If it is included (YES in S82), the control unit 2 controls the switches so as to supply the left upper audio signal LH to the left upper SP terminal 214*d*. That is, the control unit 2 controls the switches S211*e*, S213*f* to be in an ON state, and the switches S211*f*, S213*e* to be in an OFF state (S83). If the left upper audio signal LH is not included (NO in S82), the control unit 2 controls the switches S211*e*, S211*f*, S213*e*, S213*f* to be in an OFF state (S84).

Figure 18:
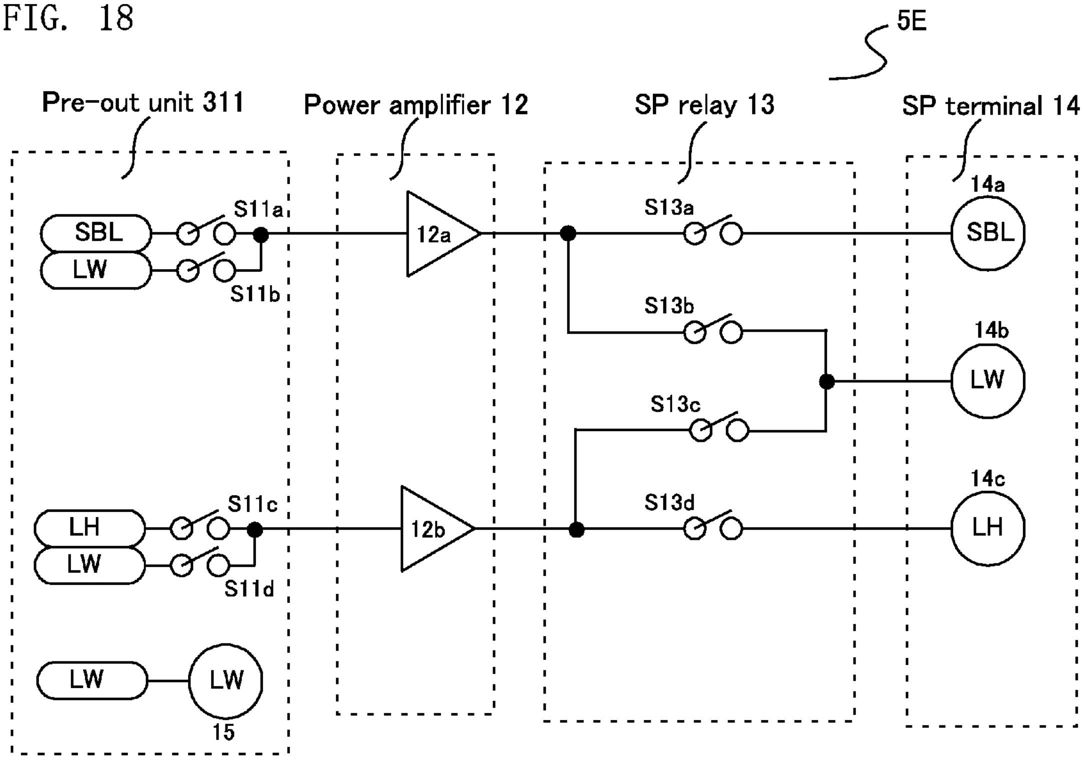
FIG. 18 is a diagram showing an audio processing unit 5E.

Next, still another embodiment of the present invention is described. FIG. 18 shows an audio processing unit 5E of the present embodiment. In the present embodiment, while for brief explanation, only the left channels are described, the right channels are similar. In the present embodiment, as compared with the embodiment in FIG. 4, the audio processing unit 5E further includes a pre-out terminal 15 to output the left outer audio signal LW to the outside of the AV amplifier 1 at the stage before it is supplied to the amplifier 12*a* or the amplifier 12*b*. If all of the surround rear left audio signal SBL, the left outer audio signal LW, and the left upper audio signal LH are included in the multichannel audio data, according to the processing in FIGS. 5 and 6, the surround rear left audio signal SBL is amplified in the amplifier 12*a* to be supplied to the surround rear left SP terminal 14*a*, and the left upper audio signal LH is amplified in the amplifier 12*b* to be supplied to the left upper SP terminal 14*c*. In this case, the left outer audio signal LW is outputted from the pre-out terminal 15. By connecting an amplifier different from the AV amplifier 1 to the pre-out terminal 15, the left outer audio signal LW can be amplified using the other amplifier so that the audio can be outputted from the speaker. As processing, after S4 in FIG. 5, it is determined whether or not the left outer audio signal LW is included in the multichannel audio data, and if it is included, the control is made so that the left outer audio signal LW is outputted from the pre-out terminal 15, and if it is not included, the control is made so that the left outer audio signal LW is not outputted from the pre-out terminal 15.

Figure 19:
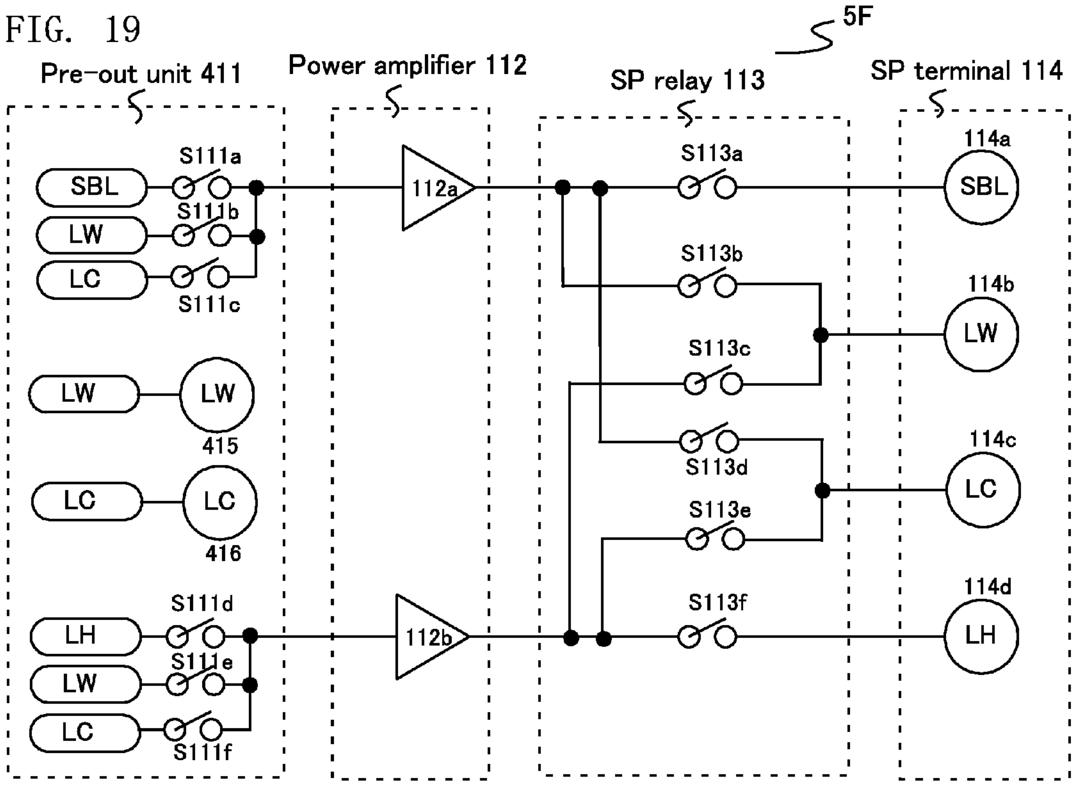
FIG. 19 is a diagram showing an audio processing unit 5F.

Next, still another embodiment of the present invention is described. FIG. 19 shows an audio processing unit 5F of the present embodiment. In the present embodiment, while for brief explanation, only the left channels are described, the right channels are similar. In the present embodiment, as compared with the embodiment in FIG. 10, the audio processing unit 5F further includes a pre-out terminal 415 to output the left outer audio signal LW to the outside of the AV amplifier 1 at the stage before it is supplied to the amplifier 112*a* or the amplifier 112*b*, and a pre-out terminal 416 to output the left central audio signal LC to the outside of the AV amplifier 1 at the stage before it is supplied to the amplifier 112*a* or the amplifier 112*b*. If the surround rear left audio signal SBL, the left outer audio signal LW, and the left upper audio signal LH are included in the multichannel audio data, according to the processing in FIGS. 11 to 13, the surround rear left audio signal SBL is amplified in the amplifier 112*a* to be supplied to the surround rear left SP terminal 114*a*, and the left upper audio signal LH is amplified in the amplifier 112*b* to be supplied to the left upper SP terminal 114*d*. In this case, the left outer audio signal LW is outputted from the pre-out terminal 415. By connecting an amplifier different from the AV amplifier 1 to the pre-out terminal 415, the left outer audio signal LW can be amplified using the other amplifier so that the audio can be outputted from the speaker.

If the surround rear left audio signal SBL, the left upper audio signal LH, and the left central audio signal LC are included in the multichannel audio data, according to the processing in FIGS. 11 to 13, the surround rear left audio signal SBL is amplified in the amplifier 112*a* to be supplied to the surround rear left SP terminal 114*a*, and the left upper audio signal LH is amplified in the amplifier 112*b* to be supplied to the left upper SP terminal 114*d*. In this case, the left central audio signal LC is outputted from the pre-out terminal 416. By connecting the amplifier different from the AV amplifier 1 to the pre-out terminal 416, the left central audio signal LC can be amplified using the other amplifier so that the audio can be outputted from the speaker.

If the surround rear left audio signal SBL, the left outer audio signal LW, the left upper audio signal LH, and the left central audio signal LC are included in the multichannel audio data, according to the processing in FIGS. 11 to 13, the surround rear left audio signal SBL is amplified in the amplifier 112*a* to be supplied to the surround rear left SP terminal 114*a*, and the left upper audio signal LH is amplified in the amplifier 112*b* to be supplied to the left upper SP terminal 114*d*. In this case, the left outer audio signal LW is outputted from the pre-out terminal 415, and the left central audio signal LC is outputted from the pre-out terminal 416. By connecting the amplifier different from the AV amplifier 1 to the pre-out terminals 415, 416, the left outer audio signal LW and the left central audio signal LC can be amplified using the other amplifier so that the audio can be outputted from the speaker.

Figure 20:
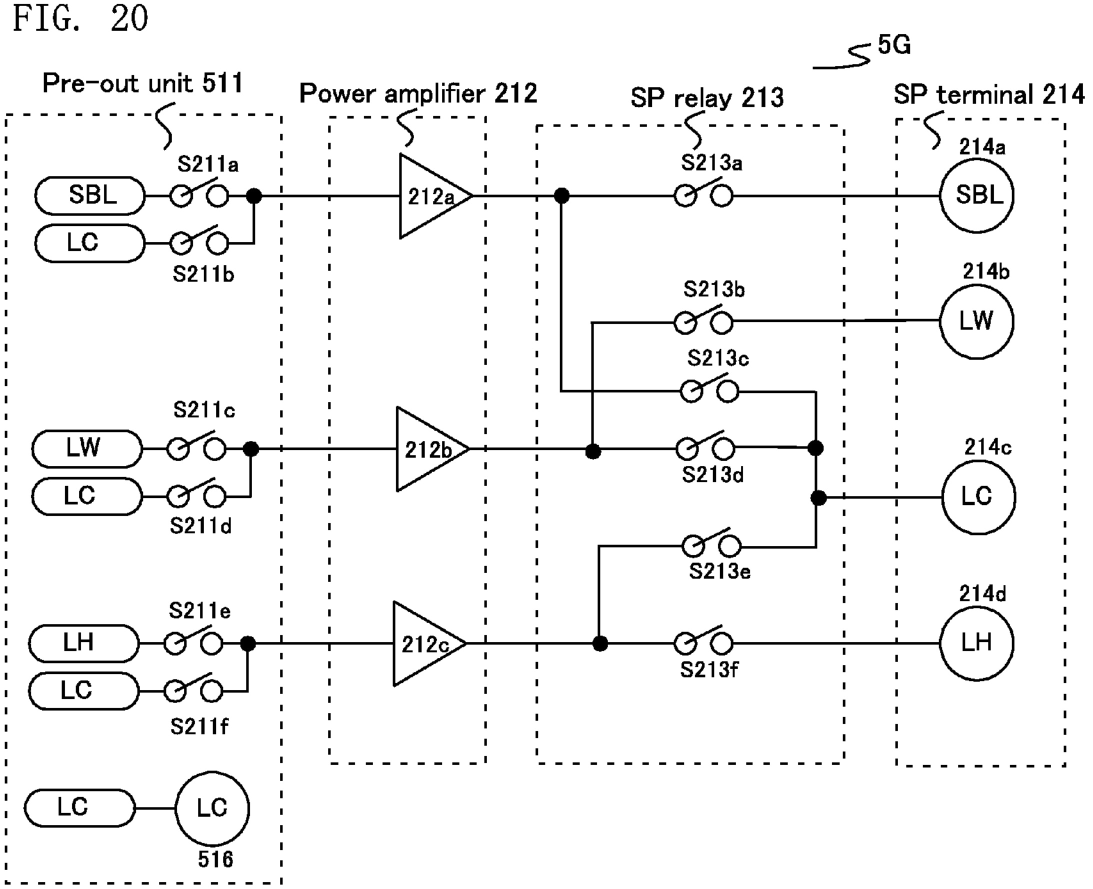
FIG. 20 is a diagram showing an audio processing unit 5G.

Next, still another embodiment of the present invention is described. FIG. 20 shows an audio processing unit 5G of the present embodiment. In the present embodiment, while for brief explanation, only the left channels are described, the right channels are similar. In the present embodiment, as compared with the embodiment in FIG. 14, the audio processing unit 5G further includes a pre-out terminal 516 to output the left central audio signal LC to the outside of the AV amplifier 1 at the stage before it is supplied to the amplifier 212*a*, 212*b* or 212*c*. If the surround rear left audio signal SBL, the left outer audio signal LW, the left upper audio signal LH, and the left central audio signal LC are included in the multichannel audio data, according to the processing in FIGS. 15 to 17, the surround rear left audio signal SBL is amplified in the amplifier 212*a* to be supplied to the surround rear left SP terminal 214*a*, the left outer audio signal LW is amplified in the amplifier 212*b* to be supplied to the left outer SP terminal 214*b*, and the left upper audio signal LH is amplified in the amplifier 212*c* to be supplied to the left upper SP terminal 214*d*. In this case, the left central audio signal LC is outputted from the pre-out terminal 516. By connecting an amplifier different from the AV amplifier 1 to the pre-out terminal 516, the left central audio signal LC can be amplified using the other amplifier so that the audio can be outputted from the speaker.

While in the foregoing, the preferred embodiments of the present invention have been described, the present invention is not limited to these embodiments. The present invention may be provided in forms of a program to cause a computer to execute the above-described operation of the AV amplifier and a recording medium that records the same.

What is claimed is:

1. An audio processing apparatus comprising:

a first amplifying unit that amplifies a first extended audio signal or a second extended audio signal, the first extended audio signal being a first extended left audio signal or a first extended right audio signal, and the second extended audio signal being a second extended left audio signal or a second extended right audio signal;

a second amplifying unit that amplifies a second extended audio signal or a third extended audio signal, the third extended audio signal being a third extended left audio signal or a third extended right audio signal;

a first speaker terminal that outputs the first extended audio signal;

a second speaker terminal that outputs the second extended audio signal;

a third speaker terminal that outputs the third extended audio signal;

a first switch that performs switching as to whether or not the first extended audio signal from the first amplifying unit is to be supplied to the first speaker terminal;

a second switch that performs switching as to whether or not the second extended audio signal from the first amplifying unit is to be supplied to the second speaker terminal;

a third switch that performs switching as to whether or not the second extended audio signal from the second amplifying unit is to be supplied to the second speaker terminal;

a fourth switch that performs switching as to whether or not the third extended audio signal from the second amplifying unit is to be supplied to the third speaker terminal;

a channel determining unit that determines which of the first extended audio signal, the second extended audio signal, and the third extended audio signal is included in multichannel audio data; and a switching control unit that if it is determined that the first extended audio signal is included, causes the first switch to supply the first extended audio signal amplified by the first amplifying unit to the first speaker terminal, if it is determined that the second extended audio signal is included, causes the second switch to supply the second extended audio signal amplified by the first amplifying unit to the second speaker terminal, or causes the third switch to supply the second extended audio signal amplified by the second amplifying unit to the second speaker terminal, and if it is determined that the third extended audio signal is included, causes the fourth switch to supply the third extended audio signal amplified by the second amplifying unit to the third speaker terminal.

2. The audio processing apparatus according to claim 1, wherein the first extended left audio signal is any of a surround rear left audio signal, a left outer audio signal, a left upper audio signal and a left central audio signal, and the first extended right audio signal is any of a surround rear right audio signal, a right outer audio signal, a right upper audio signal and a right central audio signal, the second extended left audio signal is any of the surround rear left audio signal, the left outer audio signal, the left upper audio signal and the left central audio signal, and is different from the first extended left audio signal, and the second extended right audio signal is any of the surround rear right audio signal, the right outer audio signal, the right upper audio signal and the right central audio signal, and is different from the first extended right audio signal, and the third extended left audio signal is any of the surround rear left audio signal, the left outer audio signal, the left upper audio signal and the left central audio signal, and is different from the first extended left audio signal and the second extended left audio signal, and the third extended right audio signal is any of the surround rear right audio signal, the right outer audio signal, the right upper audio signal and the right central audio signal, and is different from the first extended right audio signal and the second extended right audio signal.

3. The audio processing apparatus according to claim 1, wherein if it is determined that the first extended audio signal is not included and that the second extended audio signal is included, the switching control unit causes the second switch to supply the second extended audio signal amplified by the first amplifying unit to the second speaker terminal, and if it is determined that the first extended audio signal is included and that the second extended audio signal is included, the switching control unit causes the third switch to supply the second extended audio signal amplified by the second amplifying unit to the second speaker terminal.

4. The audio processing apparatus according to claim 1, wherein if it is determined that the first extended audio signal and the second extended audio signal are included, the switching control unit causes the first switch to supply the first extended audio signal amplified by the first amplifying unit to the first speaker terminal, and causes the third switch to supply the second extended audio signal amplified by the second amplifying unit to the second speaker terminal, if it is determined that the first extended audio signal and the third extended audio signal are included, the switching control unit causes the first switch to supply the first extended audio signal amplified by the first amplifying unit to the first speaker terminal, and causes the fourth switch to supply the third extended audio signal amplified by the second amplifying unit to the third speaker terminal, and if it is determined that the second extended audio signal and the third extended audio signal are included, the switching control unit causes the second switch to supply the second extended audio signal amplified by the first amplifying unit to the second speaker terminal, and causes the fourth switch to supply the third extended audio signal amplified by the second amplifying unit to the third speaker terminal.

5. The audio processing apparatus according to claims 1, wherein if it is determined that the first extended audio signal, the second extended audio signal, and the third extended audio signal are included, the switching control unit operates so that the two audio signals set by user operation in advance are supplied to the respective corresponding speaker terminals.

6. The audio processing apparatus according to claim 1, wherein the first amplifying unit amplifies the first extended audio signal, the second extended audio signal, or a fourth extended audio signal, the fourth extended audio signal being a fourth extended left audio signal or a fourth extended right audio signal, the second amplifying unit amplifies the second extended audio signal, the third extended audio signal or the fourth extended audio signal, the audio processing apparatus further comprises:

a fourth speaker terminal that outputs the fourth extended audio signal;

a fifth switch that performs switching as to whether or not the fourth extended audio signal from the first amplifying unit is to be supplied to the fourth speaker terminal; and a sixth switch that performs switching as to whether or not the fourth extended audio signal from the second amplifying unit is to be supplied to the fourth speaker terminal, the channel determining unit further determines whether or not the fourth extended audio signal is included in the multichannel audio data, and if it is determined that the fourth extended audio signal is included, the switching control unit causes the fifth switch to supply the fourth extended audio signal amplified by the first amplifying unit to the fourth speaker terminal, or causes the sixth switch to supply the fourth extended audio signal amplified by the second amplifying unit to the fourth speaker terminal.

7. The audio processing apparatus according to claim 6, further comprising:

a first pre-out terminal that outputs the second extended audio signal at a stage before supplying the same to the first amplifying unit or the second amplifying unit; and a second pre-out terminal that outputs the fourth extended audio signal at the stage before supplying the same to the first amplifying unit or the second amplifying unit, wherein if it is determined that the first extended audio signal, the second extended audio signal, the third extended audio signal, and the fourth extended audio signal are included, the switching control unit causes the first switch to supply the first extended audio signal amplified by the first amplifying unit to the first speaker terminal, causes the fourth switch to supply the third extended audio signal amplified by the second amplifying unit to the third speaker terminal, causes the second extended audio signal to be outputted from the first pre-out terminal, and causes the fourth extended audio signal to be outputted from the second pre-out terminal.

8. The audio processing apparatus according to claims 1, further comprising a pre-out terminal that outputs the second extended audio signal at a stage before supplying the same to the first amplifying unit or the second amplifying unit, and if it is determined that the first extended audio signal, the second extended audio signal, and the third extended audio signal are included, the switching control unit causes the first switch to supply the first extended audio signal amplified by the first amplifying unit to the first speaker terminal, causes the fourth switch to supply the third extended audio signal amplified by the second amplifying unit to the third speaker terminal, and causes the second extended audio signal to be outputted from the pre-out terminal.

9. The audio processing apparatus according to claim 1, further comprising:

a third amplifying unit that amplifies the second extended audio signal or a fourth extended audio signal, the fourth extended audio signal being a fourth extended left audio signal or a fourth extended right audio signal;

a fourth speaker terminal that outputs the fourth extended audio signal;

a fifth switch that performs switching as to whether or not the second extended audio signal from the third amplifying unit is to be supplied to the second speaker terminal; and a sixth switch that performs switching as to whether or not the fourth extended audio signal from the third amplifying unit is to be supplied to the fourth speaker terminal, wherein the channel determining unit further determines whether or not the fourth extended audio signal is included in the multichannel audio data, and if it is determined that the second extended audio signal is included, the switching control unit causes the second switch to supply the second extended audio signal amplified by the first amplifying unit to the second speaker terminal, causes the third switch to supply the second extended audio signal amplified by the second amplifying unit to the second speaker terminal, or causes the fifth switch to supply the second extended audio signal amplified by the third amplifying unit to the second speaker terminal, and if it is determined that the fourth extended audio signal is included, the switching control unit causes the sixth switch to supply the fourth extended audio signal amplified by the third amplifying unit to the fourth speaker terminal.

10. The audio processing apparatus according to claim 9, further comprising a pre-out terminal that outputs the second extended audio signal at a stage before supplying the same to the first amplifying unit, the second amplifying unit, or the third amplifying unit, and if it is determined that the first extended audio signal, the second extended audio signal, the third extended audio signal, and the fourth extended audio signal are included, the switching control unit causes the first switch to supply the first extended audio signal amplified by the first amplifying unit to the first speaker terminal, causes the fourth switch to supply the third extended audio signal amplified by the second amplifying unit to the third speaker terminal, causes the sixth switch to supply the fourth extended audio signal amplified by the third amplifying unit to the fourth speaker terminal, and causes the second extended audio signal to be outputted from the pre-out terminal.

* * * * *